(12) United States Patent
Mun et al.

(10) Patent No.: US 11,984,173 B2
(45) Date of Patent: May 14, 2024

(54) MEMORY DEVICE AND OPERATING METHOD OF THE MEMORY DEVICE

(71) Applicant: SK hynix Inc., Icheon-si (KR)

(72) Inventors: Yeong Jo Mun, Icheon-si (KR); Sung Hyun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 132 days.

(21) Appl. No.: 17/702,560

(22) Filed: Mar. 23, 2022

(65) Prior Publication Data

US 2023/0102395 A1 Mar. 30, 2023

(30) Foreign Application Priority Data

Sep. 28, 2021 (KR) ........................ 10-2021-0128051

(51) Int. Cl.
  *G11C 16/04* (2006.01)
  *G11C 16/08* (2006.01)
  *G11C 16/10* (2006.01)
  *G11C 16/24* (2006.01)
  *G11C 16/34* (2006.01)

(52) U.S. Cl.
  CPC .......... *G11C 16/3459* (2013.01); *G11C 16/08* (2013.01); *G11C 16/10* (2013.01); *G11C 16/24* (2013.01); *G11C 16/0483* (2013.01)

(58) Field of Classification Search
  CPC ..... G11C 16/3459; G11C 16/08; G11C 16/10; G11C 16/24; G11C 16/0483
  USPC .................................................... 365/185.22
  See application file for complete search history.

(56) References Cited

U.S. PATENT DOCUMENTS

| 2022/0392539 A1* | 12/2022 | Choi | ...................... G11C 7/106 |
| 2023/0084766 A1* | 3/2023 | Choi | .................. G11C 16/0483 365/185.22 |

FOREIGN PATENT DOCUMENTS

| KR | 101735586 B1 | 5/2017 |
| KR | 1020190083427 A | 7/2019 |
| KR | 1020200106748 A | 9/2020 |

* cited by examiner

*Primary Examiner* — Ly D Pham
(74) *Attorney, Agent, or Firm* — WILLIAM PARK & ASSOCIATES LTD.

(57) ABSTRACT

A memory device may include: a control circuit suitable for performing a program loop including a program operation including a program voltage application operation on a selected word line and a bit line setup operation on a plurality of bit lines and a verification operation of applying (N−1) first verification voltages to the selected word line according to a predetermined order to check N types of first program states for each of a plurality of memory cells included in the selected word line; and control logic suitable for controlling the control circuit to repeatedly perform the program loop until programming for the selected word line is completed, and controlling the control circuit to apply any one of N types of column voltages to each of the plurality of bit lines in the bit line setup operation included in a second program loop.

11 Claims, 16 Drawing Sheets

FIG. 6

| PVM | PVP | PVT | MODE |
|-----|-----|-----|------|
| ON  | ON  | ON  | PGM  |
| ON  | ON  | OFF | TPGM |
| ON  | OFF | OFF | DPGM |
| OFF | OFF | OFF | INHIBIT |
| OFF | ON  | ON  | MODE |
| OFF | OFF | ON  |      |
| ON  | OFF | ON  |      |
| OFF | ON  | OFF |      |

MEMORY DEVICE AND OPERATING METHOD OF THE MEMORY DEVICE

CROSS-REFERENCE TO RELATED APPLICATION(S)

The present application claims priority under 35 U.S.C. § 119(a) to Korean Patent Application No. 10-2021-0128051, filed on Sep. 28, 2021, the disclosure of which is incorporated herein by reference in its entirety.

BACKGROUND

1. Technical Field

Various embodiments of the present disclosure generally relate to an electronic device, and more particularly, to a memory device and an operating method of the memory device.

2. Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when its power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when its power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

In accordance with an embodiment, a memory device may include: a plurality of memory cells coupled between a plurality of word lines and a plurality of bit lines; a control circuit suitable for performing a program loop including a program operation including a program voltage application operation on a selected word line among the plurality of word lines and a bit line setup operation on the plurality of bit lines and a verification operation of applying (N−1) first verification voltages to the selected word line according to a predetermined order to check N types of first program states for each of the plurality of memory cells included in the selected word line; and control logic suitable for controlling the control circuit to repeatedly perform the program loop until programming for the selected word line is completed, and controlling the control circuit to apply any one of N types of column voltages to each of the plurality of bit lines in the bit line setup operation included in a second program loop according to a result of performing the verification operation included in a first program loop, wherein "N" is a natural number equal to or greater than 4.

In accordance with an embodiment, an operating method of a memory device, may comprise: performing a program loop including a program operation including a program voltage application operation on a selected word line among a plurality of word lines and a bit line setup operation on a plurality of bit lines and a verification operation of applying (N−1) first verification voltages to the selected word line according to a predetermined order to check N types of first program states for each of a plurality of memory cells included in the selected word line; and repeatedly performing the program loop until programming for the selected word line is completed, and applying any one of N types of column voltages to each of the plurality of bit lines in the bit line setup operation included in a second program loop according to a result of performing the verification operation included in a first program loop, wherein "N" is a natural number equal to or greater than 4.

In accordance with an embodiment, a program operating method of a memory device that performs a plurality of program loops until programming for a selected word line among a plurality of word lines is completed, wherein each of the program loops may include: generating any one of N types of column voltages according to values of N types of M-bit setting codes input to a page buffer, and applying the generated column voltage to each of a plurality of bit lines in a bit line setup operation; applying a program voltage for the selected word line in a program voltage application operation; applying (N−1) first verification voltages to the selected word line according to a predetermined order to check N types of first program states for each of a plurality of memory cells included in the selected word line in a verification operation; and determining the values of the N types of M-bit setting codes to be input to the page buffer in the bit line setup operation of a subsequent program loop, on the basis of a result of the application of the (N−1) first verification voltages to the selected word line according to the predetermined order, wherein "N" is a natural number equal to or greater than 4, and "M" is a natural number equal to or greater than 2.

BRIEF DESCRIPTION OF THE DRAWINGS

FIG. 6 is a diagram illustrating a state mode in the TPGM operation in accordance with an embodiment.

DETAILED DESCRIPTION

Figure 1:
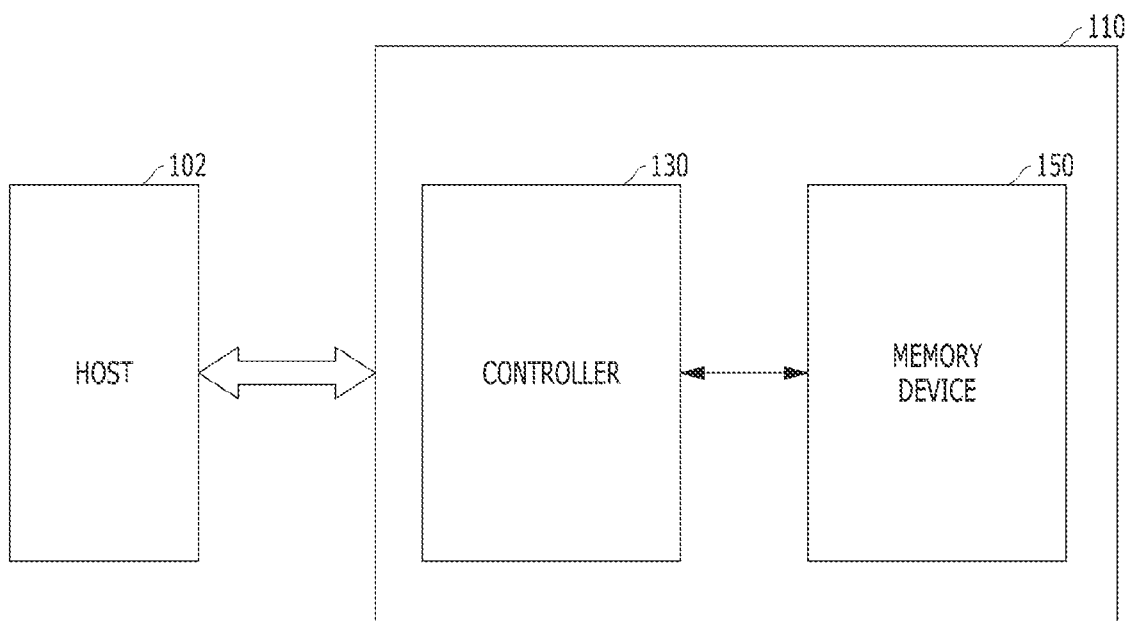
FIG. 1 is a diagram illustrating a memory system in accordance with an embodiment.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or might not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Various embodiments of the present disclosure are directed to a memory device having improved program operation performance, and an operating method thereof.

Each of the plurality of page buffers may include: an NMOS transistor suitable for coupling a bit line to the sensing node in response to a voltage application signal having any one of a predetermined level and (M−K+1) types of selection levels; and a coupling control unit suitable for coupling a ground voltage terminal and any one of K types of power source voltage terminals having sequential levels lower than the predetermined level to the sensing node in response to each of N types of M-bit setting codes being input to M latches, wherein "K" is a natural number equal to or greater than "M".

During the bit line setup operation, the control logic may control the control circuit to generate a voltage application signal having any one of a predetermined level and (M−K+1) types of selection levels and input the voltage application signal to an NMOS transistor included in each of the plurality of page buffers, and control the control circuit to input each of the plurality of M-bit setting codes to the M latches included in each of the plurality of page buffers and couple the sensing node to the ground voltage terminal and any one of the K types of power source voltage terminals through the coupling control unit.

These technical problems obtainable from the present disclosure are not limited to those described herein, and other technical problems not described herein will be apparently understood by those skilled in the art, to which the present disclosure pertains, from the following description.

FIG. 1 is a diagram illustrating a memory system in accordance with an embodiment.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The memory system 110 may include a controller 130 and a memory device 150. The memory device 150 may store data to be accessed by the host 102. The controller 130 may control an operation of storing data in the memory device 150.

The controller 130 and the memory device 150 in included the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

The memory cell array may include a plurality of memory blocks. Each memory block may include a plurality of memory cells. One memory block may include a plurality of pages. In an embodiment, each page may be a unit by which data is stored in the memory device 150 or by which data stored in the memory device 150 is read.

A memory block may be a unit by which data is erased. In an embodiment, the memory device 150 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description will be made on the assumption that the memory device 150 is a NAND flash memory.

The memory device 150 may receive a command and an address from the controller 130, and may access the area of the memory cell array, selected by the address. That is, the memory device 150 may perform an operation indicated by the command on the area selected by the address. For example, the memory device 150 may perform a write operation (i.e., program operation), a read operation, and an erase operation. During a program operation, the memory device 150 may program data to the area selected by the address. During a read operation, the memory device 150 may read data from the area selected by the address. During an erase operation, the memory device 150 may erase data stored in the area selected by the address.

The controller 130 controls the overall operation of the memory system 110.

When power is applied to the memory system 110, the controller 130 may run firmware (FW). When the memory device 150 is a flash memory device, the controller 130 may run firmware such as a flash translation layer (FTL) for controlling communication between the host 102 and the memory device 150.

In an embodiment, the controller 130 may receive data and a logical block address (LBA) from the host 102, and may translate the logical block address into a physical block address (PBA) indicating the address of memory cells which are included in the memory device 150 and in which data is to be stored. In this specification, a logical block address (LBA) and a logical address may be used in the same sense. In this specification, a physical block address (PBA) and a physical address may be used in the same sense.

The controller 130 may control the memory device 150 so that a program operation, a read operation, or an erase operation is performed in response to a request received from the host 102. During a program operation, the controller 130 may provide a program command, a physical block address, and data to the memory device 150.

During a read operation, the controller 130 may provide a read command and a physical block address to the memory device 150. During an erase operation, the controller 130 may provide an erase command and a physical block address to the memory device 150.

In an embodiment, the controller 130 may autonomously generate a command, an address, and data regardless of a request from the host 102, and may transmit the command, the address, and the data to the memory device 150. For example, the controller 130 may provide commands, addresses, and data to the memory device 150 to perform background operations, such as a program operation for wear leveling and a program operation for garbage collection.

In an embodiment, the controller 130 may control two or more memory devices 100. In such case, the controller 130 may control the memory devices 100 depending on an interleaving scheme to improve operating performance. The interleaving scheme may be an operating manner in which the operating periods of the at least two memory devices 100 are caused to overlap each other.

The host 102 may communicate with the memory system 110 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
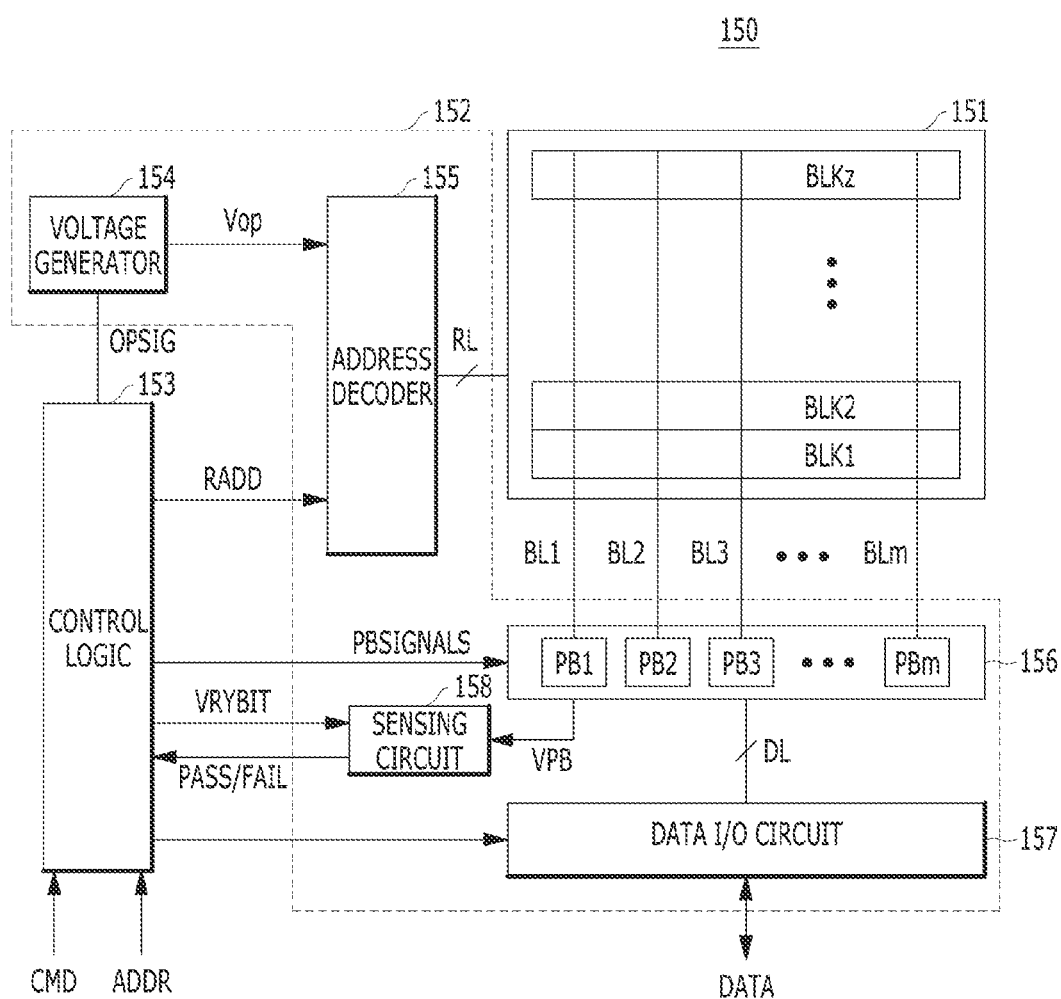
FIG. 2 is a detailed diagram illustrating a memory device illustrated in FIG. 1.

FIG. 2 is a detailed diagram illustrating a memory device illustrated in FIG. 1.

Referring to FIG. 2, the memory device 150 may include a memory cell array 151 and a control circuit 152.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The memory cells included in the memory cell array 151 may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The control circuit 152 may be configured to perform a program, read or erase operation on a selected region of the memory cell array 151. The control circuit 152 may drive the memory cell array 151. For example, the control circuit 152 may apply various operating voltages to the row line RL and the bit lines BL1 to BLm, or discharge the applied voltages.

The control circuit 152 may include the address decoder 155, a voltage generator 154, the page buffer group 156, a data input/output circuit 157, a sensing circuit 158 and a control logic 153.

The control circuit 152 may drive the memory cell array 151. For example, the control circuit 152 may drive the memory cell array 151 to perform the program, read and erase operations.

The address decoder 155 may be connected to the memory cell array 151 through the row line RL. The row line RL may include the drain selection line, the word lines, the source selection line and a common source line.

The address decoder 155 may be configured to operate in response to the control of the control logic 153. The address decoder 155 may receive an address RADD from the control logic 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltages Vop, which are supplied from the voltage generator 154, to the selected word line.

During the program operation, the address decoder 155 may apply a program voltage to the selected word line, and apply a pass voltage having a lower level than the program voltage to an unselected word line. During a program verification operation, the address decoder 155 may apply a verification voltage to the selected word line, and apply a verification pass voltage having a higher level than the verification voltage to the unselected word line.

During the read operation, the address decoder 155 may apply a read voltage to the selected word line, and apply a read pass voltage having a higher level than the read voltage to the unselected word line.

In an embodiment, the erase operation of the memory device 150 may be performed in units of memory blocks. An address ADDR input to the memory device 150 during the erase operation may include a block address. The address decoder 155 may decode the block address, and select at least one memory block according to the decoded block address. During the erase operation, the address decoder 155 may apply a ground voltage to a word line of the selected memory block.

The voltage generator 154 may be configured to generate a plurality of operating voltages Vop by using an external power supply voltage supplied to the memory device 150. The voltage generator 154 may operate in response to the control of the control logic 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic 153.

The data input/output circuit 157 may include a plurality of input/output buffers (not illustrated) that receive the data DATA input thereto. During the program operation, the data input/output circuit 157 may receive the data DATA to be stored from the controller 130 (refer to FIG. 1). The data input/output circuit 157 may output the data DATA, which is transmitted from the plurality of page buffers PB1 to PBm included in the page buffer group 156, to the controller 130 (refer to FIG. 1) during the read operation.

During the read operation or the verification operation, the sensing circuit 158 may generate a reference current in response to an allowable bit VRYBIT generated by the control logic 153, and output a pass signal PASS or a fail signal FAIL to the control logic 153 by comparing a sensing voltage VPB received from the page buffer group 156 with a reference voltage attributable to the reference current.

The control logic 153 may be connected to the address decoder 155, the voltage generator 154, the page buffer group 156, the data input/output circuit 157 and the sensing circuit 158. The control logic 153 may be configured to control overall operations of the memory device 150. The control logic 153 may operate in response to a command CMD transmitted from an external device.

The control logic 153 may generate various signals in response to the command CMD and the address ADDR, and control the other components 154 to 158 included in the control circuit 152. For example, the control logic 153 may generate an operation signal OPSIG, the address RADD, read and write circuit control signals PBSIGNALS and the allowable bit VRYBIT in response to the command CMD and the address ADDR. The control logic 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic 153 may determine whether the verification operation has passed or failed, in response to the pass or fail signal PASS or FAIL output by the sensing circuit 158.

Figure 3:
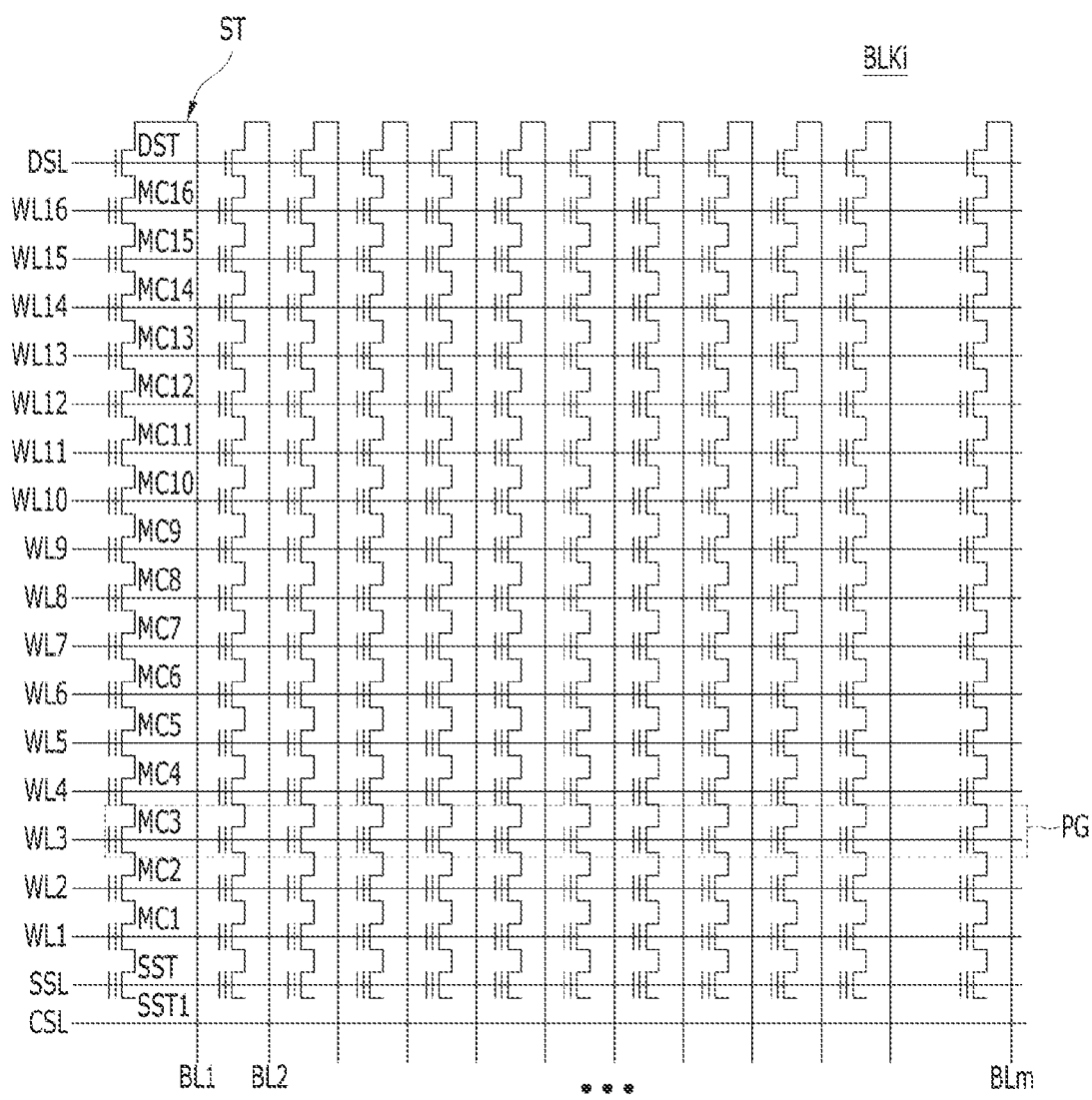
FIG. 3 is a detailed diagram illustrating a memory block illustrated in FIG. 2.

FIG. 3 is a detailed diagram illustrating a memory block illustrated in FIG. 2.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells MC1 to MC16 may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the number of word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the number of cells included in one physical page PG.

One memory cell may store two or more bits of data. In this case, one physical page PG may store two or more logical page (LPG) data.

Figure 4:
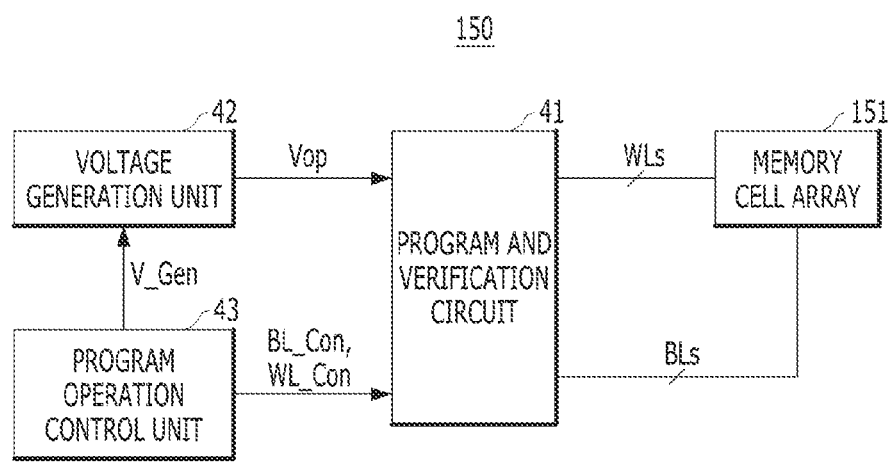
FIG. 4 is a detailed diagram illustrating the memory device illustrated in FIG. 2 in accordance with an embodiment.

FIG. 4 is a detailed diagram illustrating the memory device 150 illustrated in FIG. 2 in accordance with an embodiment.

Referring to FIG. 4, the memory device 150 may include a memory cell array 151, a program and verification circuit 41, a voltage generation unit 42 and a program operation control unit 43.

The control circuit 152 described with reference to FIG. 2 may include the program and verification circuit 41. The program and verification circuit 41 may include the address decoder 155 and the page buffer group 156 illustrated in FIG. 2. The control logic 153 described with reference to FIG. 2 may include the program operation control unit 43. The voltage generator 154 described with reference to FIG. 2 may include the voltage generation unit 42. That is, an operation of the program and verification circuit 41, which is to be described below, may be an operation of the control circuit 152, and an operation of the program operation control unit 43 may be an operation of the control logic 153.

The memory cell array 151 may include a plurality of memory cells. The memory cell array 151 may be coupled to the program and verification circuit 41 through word lines WLs coupled to the plurality of memory cells. The memory cell array 151 may be coupled to the program and verification circuit 41 through bit lines BLs coupled to the plurality of memory cells. The word lines WLs and the bit lines BLs may be cross-coupled as described in FIG. 3.

The voltage generation unit 42 may generate the operating voltages Vop, which are required for operations on the memory cells, in response to a voltage generation signal V_Gen. Among the operating voltages Vop, a voltage applied to a word line may be a word line voltage. The voltage generation unit 42 may provide the program and verification circuit 41 with the generated operating voltages Vop.

The program and verification circuit 41 may receive the operating voltages Vop from the voltage generation unit 42. The program and verification circuit 41 may generate N types of column voltages to be applied to the bit lines BLs coupled to memory cells of a selected word line during a bit line setup operation. "N" may be a natural number equal to or greater than 4. According to an embodiment, on the assumption that "N" is 4, the program and verification circuit 41 may generate 4 types of column voltages to be applied to the bit lines BLs coupled to the memory cells of the selected word line during the bit line setup operation. The program and verification circuit 41 may perform a program loop including a program operation and a verification operation, according to a bit line control signal BL_Con and a word line control signal WL_Con.

Specifically, the program operation included in the program loop may be an operation of raising a threshold voltage of a memory cell to a threshold voltage corresponding to a target program state, according to data to be stored in the memory cell. The verification operation included in the program loop may be an operation of verifying whether the program operation has been properly performed on the memory cell. That is, the verification operation may be an operation of checking whether the threshold voltage of the memory cell on which the program operation has been performed has reached the threshold voltage corresponding to the target program state of the program operation.

The program and verification circuit 41 may repeatedly perform the program loop until programming for the selected word line is completed. That is, the program and verification circuit 41 may repeatedly perform the program operation and the verification operation until the programming for the selected word line is completed.

The program and verification circuit 41 may selectively apply the N types of column voltages to each of the bit lines BLs coupled to the memory cells, according to the bit line control signal BL_Con. The program and verification circuit 41 may selectively apply the operating voltages Vop to each of the word lines WLs coupled to the memory cells, according to the word line control signal WL_Con.

The program and verification circuit 41 may perform the verification operation on the memory cell by using N−1 verification voltages in order to verify one target program state for the selected word line selected as a program target, according to the word line control signal WL_Con. Herein, "N" may be a natural number equal to or greater than 4. Accordingly, the program and verification circuit 41 may perform the verification operation on the memory cell by using L*(N−1) verification voltages in order to verify L target program states for the selected word line selected as the program target, according to the word line control signal WL_Con. Herein, "L" may be a natural number equal to or greater than 1.

According to an embodiment, on the assumption that "L" is 2, the program and verification circuit 41 may sequentially apply N−1 first verification voltages to the selected word line in order to check N types of first program states for each of the plurality of memory cells included in the selected word line during the verification operation. In addition, the program and verification circuit 41 may sequentially apply N−1 second verification voltages to the selected word line in order to check N types of second program states for each of the plurality of memory cells included in the selected word line during the verification operation. At this time, on the assumption that a level corresponding to the first program states, which are first target program states, is lower than a level corresponding to the second program states, which are second target program states, maximum levels of the N−1 second verification voltages may be higher than maximum level of the N−1 first verification voltages.

According to an embodiment, on the assumption that "N" is 4 and "L" is 1, the program and verification circuit 41 may perform the verification operation of verifying 4 types of program states by using three verification voltages in order to check one target program state for each of the plurality of memory cells included in the selected word line.

According to an embodiment, on the assumption that "N" is 4 and "L" is 2, the program and verification circuit 41 may perform the verification operation of verifying 4 types of first program states by using three first verification voltages in order to check the first program states, which are the first target program states for each of the plurality of memory cells included in the selected word line and verifying 4 types of second program states by using three second verification voltages in order to check the second program states, which are the second target program states for each of the plurality of memory cells included in the selected word line.

In this way, the program loop including the verification operation of verifying the 4 types of program states by using three verification voltages to verify one target program state may be defined as a triple verify PGM (TPGM) operation.

More specifically, on the assumption that "N" is 4 and "L" is 1, the program and verification circuit 41 may verify the 4 types of program states for each of the plurality of memory cells included in the selected word line, by using three verification voltages, that is, an additional verification voltage, a pre-verification voltage and a main verification voltage in order to check one target program state for the selected word line. The program and verification circuit 41 may apply the additional verification voltage to the selected word line during an additional verification operation according to the word line control signal WL_Con. The program and verification circuit 41 may apply the pre-verification voltage to the selected word line during a pre-verification operation according to the word line control signal WL_Con. The program and verification circuit 41 may apply the main verification voltage to the selected word line during a main verification operation according to the word line control signal WL_Con.

According to an embodiment, the main verification voltage may be a verification voltage corresponding to the target program state of the program operation. The pre-verification voltage may be a voltage for verifying the degree to which the program operation is performed on the memory cells, at a level lower than a level of the main verification voltage. The additional verification voltage may be a voltage for verifying the degree to which the program operation is performed on the memory cells, at a level lower than a level of the pre-verification voltage.

As a result of performing the verification operation on the memory cells of the selected word line, a first cell may be a memory cell having a threshold voltage lower than the additional verification voltage. A second cell may be a memory cell having a threshold voltage higher than the additional verification voltage and lower than the pre-verification voltage. A third cell may be a memory cell having a threshold voltage higher than the pre-verification voltage and lower than the main verification voltage. A program inhibited cell may be a memory cell having a threshold voltage higher than the main verification voltage.

The program operation on the first cell having the threshold voltage lower than the additional verification voltage needs to be performed rapidly. The program operation on the second cell having the threshold voltage higher than the additional verification voltage and lower than the pre-verification voltage needs to be performed more slowly than the program operation on the first cell. The program operation on the third cell having the threshold voltage higher than the pre-verification voltage and lower than the main verification voltage needs to be performed more slowly than the program operation on the second cell. Since a fourth cell having a threshold voltage higher than the main verification voltage is in the first program state, which is the target program state, and the programming has been completed on the fourth cell, the program operation on the fourth cell needs to be inhibited.

The program operation included in the program loop may include a bit line setup operation and a program voltage application operation.

The bit line setup operation may be an operation of setting potentials of the bit lines BLs, which are coupled to the memory cells of the selected word line selected as the program target among the plurality of word lines WLs, to voltages required for the program operation.

The program voltage application operation may be an operation of applying a program voltage to the selected word line.

The program voltage application operation may be performed after the bit line setup operation is performed. Some of performance periods of the program voltage application operation may overlap some of performance periods of the bit line setup operation.

The voltage generation unit 42 may generate the program voltage to be applied to the selected word line, in response to the voltage generation signal V_Gen.

Any one of the N types of column voltages may be applied to each of the plurality of bit lines BLs in the bit line setup operation included in the program operation of a subsequent program loop according to a result of verifying N types of program states for each of the plurality of memory cells included in the selected word line in order to check one target program state in the above-described verification operation of the program loop. That is, any one of the N types of column voltages may be applied to each of the plurality of bit lines BLs in the bit line setup operation included in the program operation of a second program loop to be performed later according to the result of verifying the N types of program states for each of the plurality of memory cells included in the selected word line in order to check one target program state in the verification operation of a first program loop performed first. According to an embodiment, on the assumption that "N" is 4, any one of 4 types of column voltages may be applied to each of the plurality of bit lines BLs in the bit line setup operation included in the program operation of the second program loop performed later according to a result of verifying 4 types of program states for each of the plurality of memory cells included in the selected word line in order to check one target program state in the verification operation of the first program loop performed previously.

More specifically, on the assumption that "N" is 4, the 4 types of column voltages may include a first allowable voltage, a second allowable voltage, a third allowable voltage and an inhibiting voltage. The first allowable voltage may have a lower voltage level than the second allowable voltage. The second allowable voltage may have a lower voltage level than the third allowable voltage. The third allowable voltage may have a lower voltage level than the inhibiting voltage. The first allowable voltage may have a ground voltage level or a negative voltage level lower than the ground voltage level. The inhibiting voltage may be a voltage applied to a bit line coupled to a memory cell so that the memory cell is not programmed. The inhibiting voltage may have a power source voltage level.

The program and verification circuit 41 may apply the inhibiting voltage to a bit line coupled to the program inhibited cell among the plurality of memory cells included in the selected word line in the bit line setup operation, according to the bit line control signal BL_Con. The program and verification circuit 41 may apply the first allowable voltage to a bit line coupled to the first cell having the threshold voltage lower than the additional verification voltage among the plurality of memory cells included in the selected word line in the bit line setup operation, according to the bit line control signal BL_Con. The program and verification circuit 41 may apply the second allowable voltage to a bit line coupled to the second cell having the threshold voltage higher than the additional verification voltage and lower than the pre-verification voltage among the plurality of memory cells included in the selected word line in the bit line setup operation, according to the bit line control signal BL_Con. The program and verification circuit 41 may apply the third allowable voltage to a bit line coupled to the third cell having the threshold voltage higher than the pre-verification voltage and lower than the main verification voltage among the plurality of memory cells included in the selected word line in the bit line setup operation, according to the bit line control signal BL_Con.

The program and verification circuit 41 may apply any one of the N types of column voltages to each of the plurality of bit lines through the bit line setup operation, and then apply the program voltage to the selected word line through the program voltage application operation according to the word line control signal WL_Con.

According to an embodiment, the intensity of the program operation on the third cell may be lower than that of the program operation on the second cell. At the same time, the intensity of the program operation on the second cell may be lower than that of the program operation on the first cell. The program intensity may be determined according to time for which a program pulse is applied, the number of times that the program pulse is applied, and a potential difference between the program pulses. For example, during a period in which the program voltage is applied to the selected word line coupled in common to the first to third cells, the first allowable voltage having the ground voltage level may be applied to the bit line coupled to the first cell, the second allowable voltage having a level higher than the ground voltage level may be applied to the bit line coupled to the second cell, and the third allowable voltage having a higher level than the second allowable voltage may be applied to the bit line coupled to the third cell. In this case, since a potential difference of the program voltage applied to the third cell is smaller than that of the program voltage applied to the second cell, the intensity of the program operation on the third cell may be lower than that of the program operation on the second cell. Similarly, since a potential difference of the program voltage applied to the second cell is smaller than that of the program voltage applied to the first cell, the intensity of the program operation on the second cell may be lower than that of the program operation on the first cell.

The program operation of the program inhibited cell may be restricted. For example, while the program voltage is applied to the selected word line coupled to the program inhibited cell, the inhibiting voltage having the power source voltage level may be applied to a bit line coupled to the program inhibited cell. In this case, since a potential difference of the program voltage applied to the program inhibited cell becomes smaller than a potential difference for raising a threshold voltage of the memory cell, the program operation for raising a threshold voltage of the program inhibited cell may be restricted.

The program operation control unit 43 may provide the voltage generation unit 42 with the voltage generation signal V_Gen for controlling the generation of the operating voltages Vop required for the program operation or the verification operation. The program operation control unit 43 may provide the program and verification circuit 41 with the word line control signal WL_Con for controlling that the operation voltages Vop generated by the voltage generation unit 42 are selectively applied to each of the word lines WLs coupled to the memory cells. The program operation control unit 43 may provide the program and verification circuit 41 with the bit line control signal BL_Con for controlling that the operation voltages Vop generated by the voltage generation unit 42 are selectively applied to each of the bit lines BLs coupled to the memory cells.

According to an embodiment, the program operation control unit 43 may generate the voltage generation signal V_Gen and provide the voltage generation unit 42 with the voltage generation signal V_Gen in the verification operation, thereby controlling the voltage generation unit 42 to generate the N−1 verification voltages. The program operation control unit 43 may generate the word line control signal WL_Con and provide the program and verification circuit 41 with the word line control signal WL_Con to sequentially apply the N−1 verification voltages generated by the voltage generation unit 42 to the selected word line in the verification operation.

According to an embodiment, in the bit line setup operation, the program operation control unit 43 may generate the voltage generation signal V_Gen and provide the voltage generation unit 42 with the voltage generation signal V_Gen, and may generate an M-bit set code and provide the program and verification circuit 41 with the M-bit set code, thereby controlling the program and verification circuit 41 to generate the N types of column voltages. The program operation control unit 43 may generate the bit line control signal BL_Con and provide the program and verification circuit 41 with the bit line control signal BL_Con to apply any one of the N types of column voltages generated by the program and verification circuit 41 to each of the plurality of bit lines in the period of the bit line setup operation.

According to an embodiment, the program operation control unit 43 may generate the voltage generation signal V_Gen and provide the voltage generation unit 42 with the voltage generation signal V_Gen in the program voltage application operation, thereby controlling the voltage generation unit 42 to generate the program voltage. The program operation control unit 43 may generate the word line control signal WL_Con and provide the program and verification circuit 41 with the word line control signal WL_Con to apply the program voltage generated by the voltage generation unit 42 to the selected word line in the program voltage application operation.

Figure 5:
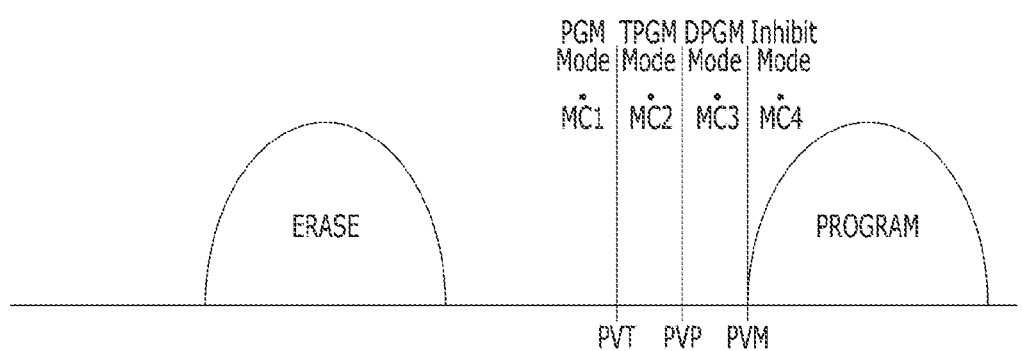
FIG. 5 is a diagram illustrating a triple verify PGM (TPGM) operation in accordance with an embodiment.

FIG. 5 is a diagram illustrating a triple verify PGM (TPGM) operation in accordance with an embodiment.

Referring to FIG. 5, the TPGM operation may be a program loop including a verification operation of verifying four program states by using three verification voltages PVT, PVP and PVM to verify one target program state after a program operation is performed. The three verification voltages may be an additional verification voltage PVT, a pre-verification voltage PVP and a main verification voltage PVM. The main verification voltage PVM may be a verification voltage corresponding to a target program state of the program operation. Each of the additional verification voltage PVT and the pre-verification voltage PVP may be a voltage for verifying the degree to which the program operation is performed on memory cells, at a level lower than a level of the main verification voltage PVM.

In FIG. 5, it is assumed that the memory cells are single-level cells (SLC) each storing one data bit. Accordingly, the target program state of the program operation on the memory cells may be one, that is, a program state PROGRAM.

A state mode may be determined according to a verification result of the program operation on the memory cells. The state mode may include a first state mode PGM Mode, a second state mode TPGM Mode, a third state mode DPGM Mode and an inhibiting mode Inhibit Mode.

Since a threshold voltage of a first memory cell MC1 is lower than the additional verification voltage PVT, the state mode of the first memory cell MC1 may be the first state mode PGM Mode. Since a threshold voltage of a second memory cell MC2 is higher than the additional verification voltage PVT and lower than the pre-verification voltage PVP, the state mode of the second memory cell MC2 may be the second state mode TPGM Mode. Since a threshold voltage of a third memory cell MC3 is higher than the pre-verification voltage PVP and lower than the main verification voltage PVM, the state mode of the third memory cell MC3 may be the third state mode DPGM Mode. Since a threshold voltage of a fourth memory cell MC4 is higher than the main verification voltage PVM, the state mode of the fourth memory cell MC4 may be the inhibiting mode Inhibit Mode.

In order to reach the program state PROGRAM, which is the target program state, the program operation on the first memory cell MC1 needs to be performed rapidly. In order to reach the program state PROGRAM, which is the target program state, the program operation on the second memory cell MC2 needs to be performed more slowly than on the first memory cell MC1. In order to reach the program state PROGRAM, which is the target program state, the program operation on the third memory cell MC3 needs to be performed more slowly than on the second memory cell MC2. Since the fourth memory cell MC4 has been completely programmed to reach the target program state PROGRAM, the program operation on the fourth memory cell MC4 needs to be inhibited.

Accordingly, the intensity of the program operation on the third memory cell MC3 may be lower than that of the program operation on the second memory cell MC2. Also, the intensity of the program operation on the second memory cell MC2 may be lower than that of the program operation on the first memory cell MC1. The program intensity may be determined according to time for which the program pulse is applied, the number of times that the program pulse is applied, and a potential difference between the program pulses.

For example, during a period in which a program voltage is applied to a word line, the first allowable voltage may be applied to a bit line coupled to the first memory cell MC1, and the second allowable voltage higher than the first allowable voltage may be applied to a bit line coupled to the second memory cell MC2. In this case, since the potential difference between the program pulses applied to the second memory cell MC2 is smaller than that between the program pulses applied to the first memory cell MC1, the program operation may be performed with a lower intensity on the second memory cell MC2.

Similarly, during the period in which the program voltage is applied to the word line, the second allowable voltage may be applied to a bit line coupled to the second memory cell MC2, and the third allowable voltage higher than the second allowable voltage may be applied to a bit line coupled to the third memory cell MC3. In this case, since the potential difference between the program pulses applied to the third memory cell MC3 is smaller than that between the program pulses applied to the second memory cell MC2, the program operation may be performed with a lower intensity on the third memory cell MC3.

The program operation on the fourth memory cell MC4 may be restricted. For example, while the program pulse is applied to the word line, the inhibiting voltage may be applied to a bit line coupled to the fourth memory cell MC4. In this case, since the potential difference of the program pulse applied to the fourth memory cell MC4 becomes smaller than the potential difference for raising a threshold voltage of the memory cell, the program operation for raising the threshold voltage of the fourth memory cell MC4 may be restricted.

According to an embodiment, the first allowable voltage may have a ground voltage VSS level or a negative voltage level lower than the ground voltage VSS level. The second allowable voltage may have a level higher than the ground voltage VSS level, for example, a 0.25 V level. The third allowable voltage may have a higher level than the second allowable voltage, for example, a 0.5 V level. The inhibiting voltage may have a power source voltage VCORE level, for example, a 1.8 V level.

FIG. 6 is a diagram illustrating a state mode in the TPGM operation in accordance with an embodiment.

Referring to FIG. 6, the state mode may be determined according to a verification result of the program operation on memory cells. The state mode may include a first state mode PGM Mode, a second state mode TPGM Mode, a third state mode DPGM Mode and an inhibiting mode Inhibit Mode.

For example, a verification pass OFF indicates that a memory cell is read as an off-cell by a corresponding verification voltage. A verification fail ON indicates that a memory cell is read as an on-cell by a corresponding verification voltage. In other words, when a threshold voltage of the memory cell is lower than the verification voltage or located on the left side, the memory cell is read as the on-cell, and when the threshold voltage of the memory cell is higher than the verification voltage or located on the right side, the memory cell is read as the off-cell.

Referring to FIGS. 5 and 6, the memory cell having a state mode that is the first state mode PGM Mode may be read as the on-cell ON by each of the additional verification voltage PVT, the pre-verification voltage PVP and the main verification voltage PVM.

The memory cell having a state mode that is the second state mode TPGM Mode may be read as the off-cell OFF by the additional verification voltage PVT, and be read as the on-cell ON by each of the pre-verification voltage PVP and the main verification voltage PVM.

The memory cell having a state mode that is the third state mode DPGM Mode may be read as the off-cell OFF by each of the additional verification voltage PVT and the pre-verification voltage PVP, and read be as the on-cell ON by the main verification voltage PVM.

The memory cell having a state mode that is the inhibiting mode Inhibit Mode may be read as the off-cell OFF by each of the additional verification voltage PVT, the pre-verification voltage PVP and the main verification voltage PVM.

Since the additional verification voltage PVT is lower than the pre-verification voltage PVP and the main verification voltage PVM, it may be impossible for the memory cell to be read as the on-cell ON by the additional verification voltage PVT and to be read as the off-cell OFF by the pre-verification voltage PVP or the main verification voltage PVM. In addition, since the pre-verification voltage PVP is lower than the main verification voltage PVM, it may be impossible for the memory cell to be read as the on-cell ON by the pre-verification voltage PVP and to be read as the off-cell OFF by the main verification voltage PVM.

Figure 7:
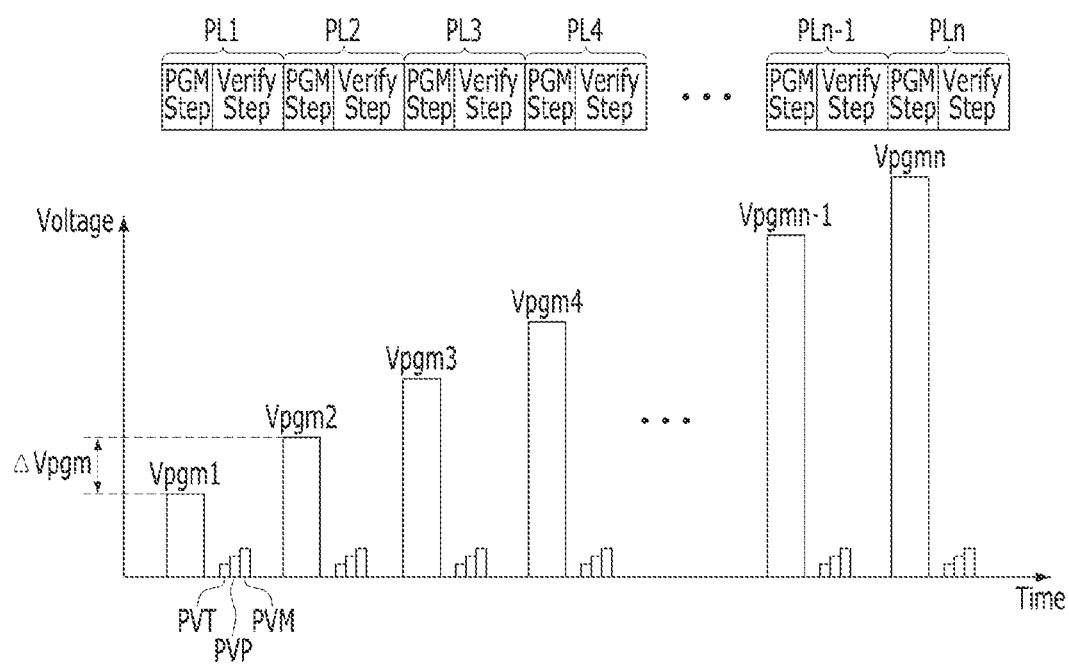
FIG. 7 is a diagram illustrating an incremental step pulse program operation including the TPGM operation in accordance with an embodiment.

FIG. 7 is a diagram illustrating an incremental step pulse program (ISPP) operation including the TPGM operation in accordance with an embodiment.

Referring to FIGS. 5 and 7, the ISPP operation may include a plurality of program loops PL1 to PLn. That is, the memory device 150 performing the ISPP program may repeatedly perform the plurality of program loops PL1 to PLn according to a predetermined order until the programming is completed, and thus program each of a plurality of memory cells included in a selected word line so that each of the plurality of memory cells has any one of an erased state ERASE and a program state PROGRAM, which is a target program state. The word "predetermined" as used herein with respect to a parameter, such as a predetermined order and predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Each of the plurality of program loops PL1 to PLn may include a program operation PGM Step including a program voltage application operation of applying a program voltage to the selected word line and a bit line setup operation for a plurality of bit lines BLs, and a verification operation Verify Step of sequentially applying N−1 verification voltages to the selected word line and verifying which program state each of the plurality of memory cells included in the selected word line has among N types of first program states. In this way, according to a result of verifying the N types of program states for each of the plurality of memory cells included in the selected word line in the verification step Verify Step of a preceding program loop, any one of N types of column voltages may be applied to each of the plurality of bit lines BLs in the bit line setup operation included in the program operation PGM Step of a subsequent program loop. That is, according to a result of verifying the N types of first program states for each of the plurality of memory cells included in the selected word line in the verification step Verify Step of the first program loop PL1 performed previously, any one of the N types of column voltages may be applied to each of the plurality of bit lines BLs in the bit line setup operation included in the program operation PGM Step of the second program loop PL2 performed subsequently.

Specifically, on the assumption that "N" is 4, in the verification step Verify Step, the verification operation may be performed on each of the plurality of memory cells included in the selected word line, by the additional verification voltage PVT, the pre-verification voltage PVP and the main verification voltage PVM. The main verification voltage PVM may be a verification voltage corresponding to the target program state of the program operation. The pre-verification voltage PVP may be a voltage that verifies the degree to which the program operation is performed on the memory cells, at a level lower than a level of the main verification voltage PVM. Similarly, the additional verification voltage PVT may be a voltage that verifies the degree to which the program operation is performed on the memory cells, at a level lower than a level of the pre-verification voltage PVP.

For example, a verification pass indicates that a memory cell is read as an off-cell by a corresponding verification voltage. A verification fail indicates that a memory cell is read as an on-cell by a corresponding verification voltage.

For example, when the first program loop PL1 is performed, the additional verification voltage PVT, the pre-verification voltage PVP and the main verification voltage PVM may be applied in a predetermined order so that the program states of the plurality of memory cells included in the selected word line are verified in the verification operation Verify Step after a first program voltage Vpgm1 is applied. The predetermined order may refer to an order of sequentially applying the additional verification voltage PVT, the pre-verification voltage PVP and the main verification voltage PVM to the selected word line. Conversely, the predetermined order may refer to an order of sequentially applying the main verification voltage PVM, the pre-verification voltage PVP and the additional verification voltage PVT to the selected word line.

According to an embodiment, memory cells, which are read as the verification fail by the additional verification voltage PVT, may be determined as memory cells having state modes that are the first state modes PGM Mode. Memory cells, which are read as the verification pass by the additional verification voltage PVT and as verification fail by the pre-verification voltage PVP, may be determined as memory cells having state modes that are the second state modes TPGM Mode. Memory cells, which are read as the verification pass by the pre-verification voltage PVP and as the verification fail by the main verification voltage PVM, may be determined as memory cells having state modes that are the third state modes DPGM Mode. Memory cells, which are read as the verification pass by the main verification voltage PVM, may be determined as memory cells having state modes that are the inhibiting modes Inhibit Mode. The memory cells having state modes that are the inhibiting modes Inhibit Mode may be program-inhibited in the second program loop PL2 that is performed after the first program loop PL1.

A second program voltage Vpgm2 higher than the first program voltage Vpgm1 used in the first program loop PL1 by a unit voltage $\Delta$Vpgm may be applied so that the other memory cells except for the cells inhibited from being programmed in the second program loop PL2 are programmed. Subsequently, the verification operation of the second program loop PL2 may be performed in the same manner as the verification operation of the first program loop PL1.

In the verification operation Verify Step, it may be determined whether the verification of each of the plurality of memory cells included in the selected word line has passed, on the basis of currents or voltages flowing through the plurality of bit lines coupled to each of the plurality of memory cells included in the selected word line.

Figure 8:
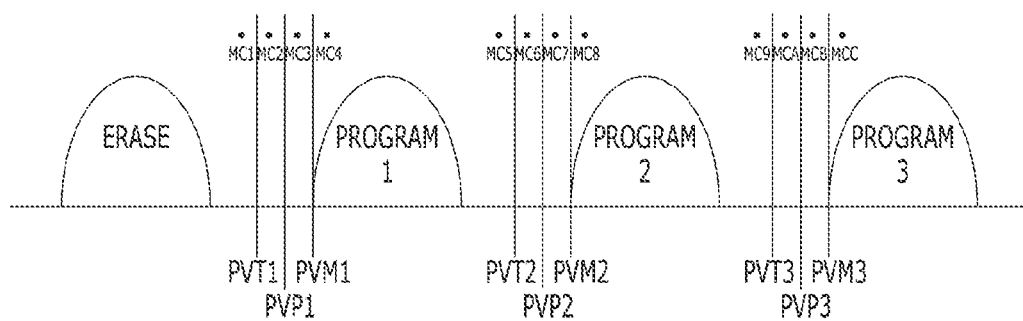
FIG. 8 is a diagram illustrating the TPGM operation in accordance with another embodiment.

FIG. 8 is a diagram illustrating the TPGM operation in accordance with another embodiment.

The TPGM operation according to the present embodiment described above with reference to FIGS. 5 to 7 has been described on the assumption that the memory cells are single-level cells (SLC) each storing one data bit. Accordingly, the TPGM operation according to the present embodiment described in FIG. 5 may include the verification operation of verifying the 4 types of program states by using the three verification voltages to check one target program state, that is, the program state PROGRAM.

Referring to FIG. 8, the TPGM operation is described on the assumption that the memory cells are multi-level cells (MLC) each storing two data bits.

Herein, it may be assumed that programming for the multi-level memory cells includes three target program states, that is, a first program state PROGRAM1, a second program state PROGRAM2 and a third program state PROGRAM3. Accordingly, the plurality of program loops PL1 to PLn may be repeatedly performed in a predetermined order through the ISPP operation described in FIG. 7 so that each of the plurality of multi-level memory cells included in the selected word line may be programmed to have an erased state ERASE and any one of the first to third program states PROGRAM1, PROGRAM2 and PROGRAM3, which are the target program states.

Since it is assumed that the programming for the multi-level memory cells includes three target program states PROGRAM1, PROGRAM2 and PROGRAM3, one program loop among the plurality of program loops PL1 to PLn may include a verification operation in which an operation of verifying fourth program states by using three verification voltages PVT1, PVP1 and PVM1 or PVT2, PVP2 and PVM2 or PVT3, PVP3 and PVM3 to check one target program state PROGRAM1, PROGRAM2 or PROGRAM3 after the program operation is performed is repeatedly performed a maximum of 3 times.

According to an embodiment, three first verification voltages PVT1, PVP1 and PVM1, that is, a first additional verification voltage PVT1, a first pre-verification voltage PVP1 and a first main verification voltage PVM1, may be used to check the first program state PROGRAM1 among the three target program states PROGRAM1, PROGRAM2 and PROGRAM3. In this case, the first main verification voltage PVM1 may be a verification voltage corresponding to the first program state PROGRAM1.

Three second verification voltages PVT2, PVP2 and PVM2, that is, a second additional verification voltage PVT2, a second pre-verification voltage PVP2 and a second main verification voltage PVM2, may be used to check the second program state PROGRAM2 among the three target program states PROGRAM1, PROGRAM2 and PROGRAM3. In this case, the second main verification voltage PVM2 may be a verification voltage corresponding to the second program state PROGRAM2.

Three third verification voltages PVT3, PVP3 and PVM3, that is, a third additional verification voltage PVT3, a third pre-verification voltage PVP3 and a third main verification voltage PVM3, may be used to check the third program state PROGRAM3 among the three target program states PROGRAM1, PROGRAM2 and PROGRAM3. In this case, the third main verification voltage PVM3 may be a verification voltage corresponding to the third program state PROGRAM3.

Among the three target program states PROGRAM1, PROGRAM2 and PROGRAM3, the first program state PROGRAM1 may have the lowest level, and the third program state PROGRAM3 may have the highest level. Accordingly, a maximum level of the three first verification voltages PVT1, PVP1 and PVM1 for checking the first program state PROGRAM1, that is, a level of the first main verification voltage PVM1, may be lower than a maximum level of the three second verification voltages PVT2, PVP2 and PVM2 for checking the second program state PROGRAM2, that is, a level of the second main verification voltage PVM2.

Similarly, the maximum level of the three second verification voltages PVT2, PVP2 and PVM2 for checking the second program state PROGRAM2, that is, the level of the second main verification voltage PVM2 may be lower than a maximum level of the three third verification voltages PVT3, PVP3 and PVM3 for checking the third program state PROGRAM3, that is, a level of the third main verification voltage PVM3.

A state mode for each of the three target program states PROGRAM1, PROGRAM2 and PROGRAM3 may be determined according to a verification result of the program operation on the memory cells as described with reference to FIG. 5.

That is, the state mode for the first program state PROGRAM1 may include a first state mode PGM Mode, a second state mode TPGM Mode, a third state mode DPGM Mode and an inhibiting mode Inhibit Mode. The state mode for the second program state PROGRAM2 may include a first state mode PGM Mode, a second state mode TPGM Mode, a third state mode DPGM Mode and an inhibiting mode Inhibit Mode. The state mode for the third program state PROGRAM3 may include a first state mode PGM Mode, a second state mode TPGM Mode, a third state mode DPGM Mode and an inhibiting mode Inhibit Mode.

First to fourth memory cells MC1, MC2, MC3 and MC4 may have the first program state PROGRAM1 as the target program state. Fifth to eighth memory cells MC5, MC6, MC7 and MC8 may have the second program state PROGRAM2 as the target program state. Ninth to $12^{th}$ memory cells MC9, MCA, MCB and MCC may have the third program state PROGRAM3 as the target program state.

Since a threshold voltage of the first memory cell MC1 is lower than the first additional verification voltage PVT1, a threshold voltage of the fifth memory cell MC5 is lower than the second additional verification voltage PVT2, and a threshold voltage of the ninth memory cell MC9 is lower than the third additional verification voltage PVT3, the state modes of the first, fifth and ninth memory cells MC1, MC5 and MC9 may be the first state modes PGM Mode.

Since a threshold voltage of the second memory cell MC2 is higher than the first additional verification voltage PVT1 and lower the first pre-verification voltage PVP1, a threshold voltage of the sixth memory cell MC6 is higher than the second additional verification voltage PVT2 and lower than the second pre-verification voltage PVP2, and a threshold voltage of the $10^{th}$ memory cell MC10 is higher than the third additional verification voltage PVT3 and lower than the third pre-verification voltage PVP3, the state modes of the second, sixth and $10^{th}$ memory cells MC2, MC6 and MCA may be the second state modes TPGM Mode.

Since a threshold voltage of the third memory cell MC3 is higher than the first pre-verification voltage PVP1 and lower the first main verification voltage PVM1, a threshold voltage of the seventh memory cell MC7 is higher than the second pre-verification voltage PVP2 and lower than the second main verification voltage PVM2, and a threshold voltage of the $11^{th}$ memory cell MCB is higher than the third pre-verification voltage PVP3 and lower than the third main verification voltage PVM3, the state modes of the third, seventh and $11^{th}$ memory cells MC3, MC7 and MCB may be the third state modes DPGM Mode.

Since a threshold voltage of the fourth memory cell MC4 is higher than the first main verification voltage PVM1, a threshold voltage of the eighth memory cell MC8 is lower than the second main verification voltage PVM2, and a threshold voltage of the $12^{th}$ memory cell MCC is higher than the third main verification voltage PVM3, the state modes of the fourth, eighth and $12^{th}$ memory cells MC4, MC8 and MCC may be the inhibiting modes Inhibit Mode.

The program operation needs to be performed rapidly on the first memory cell MC1, the fifth memory cell MC5 and the ninth memory cell MC9 so that the first memory cell MC1, the fifth memory cell MC5 and the ninth memory cell MC9 may reach the first program state PROGRAM1, the second program state PROGRAM2 and the third program state PROGRAM3, respectively, which are the target program states.

The program operation needs to be performed on the second memory cell MC2, the sixth memory cell MC6 and the $10^{th}$ memory cell MCA more slowly than on the first memory cell MC1, the fifth memory cell MC5 and the ninth memory cell MC9 so that the second memory cell MC2, the sixth memory cell MC6 and the $10^{th}$ memory cell MCA may reach the first program state PROGRAM1, the second program state PROGRAM2 and the third program state PROGRAM3, respectively, which are the target program states.

The program operation needs to be performed on the third memory cell MC3, the seventh memory cell MC7 and the $11^{th}$ memory cell MCB more slowly than on the second memory cell MC2, the sixth memory cell MC6 and the $10^{th}$ memory cell MCA so that the third memory cell MC3, the seventh memory cell MC7 and the $11^{th}$ memory cell MCB may reach the first program state PROGRAM1, the second program state PROGRAM2 and the third program state PROGRAM3, respectively, which are the target program states.

Since the programming has been completed on the fourth memory cell MC4, the eighth memory cell MC8 and the $12^{th}$ memory cell MCC having the first program state PROGRAM1, the second program state PROGRAM2 and the third program state PROGRAM3, respectively, which are the target program states, the program operation on the fourth memory cell MC4, the eighth memory cell MC8 and the $12^{th}$ memory cell MCC needs to be inhibited.

Accordingly, the intensity of the program operation on each of the third memory cell MC3, the seventh memory cell MC7 and the $11^{th}$ memory cell MCB may be lower than that of the program operation on each of the second memory cell MC2, the sixth memory cell MC6 and the $10^{th}$ memory cell MCA. In addition, the intensity of the program operation on each of the second memory cell MC2, the sixth memory cell MC6 and the $10^{th}$ memory cell MCA may be lower than that of the program operation on each of the first memory cell MC1, the fifth memory cell MC5 and the ninth memory cell MC9. The program intensity may be determined according to time for which the program pulse is applied, the number of times that the program pulse is applied and a potential difference between the program pulses.

For example, during a period in which a program voltage is applied to a word line, the first allowable voltage may be applied to a bit line coupled to each of the first memory cell MC1, the fifth memory cell MC5 and the ninth memory cell MC9, and the second allowable voltage higher than the first allowable voltage may be applied to a bit line coupled to each of the second memory cell MC2, the sixth memory cell MC6 and the $10^{th}$ memory cell MCA. In this case, since the potential difference between the program pulses applied to each of the second memory cell MC2, the sixth memory cell MC6 and the $10^{th}$ memory cell MCA is smaller than that between the program pulses applied to each of the first memory cell MC1, the fifth memory cell MC5 and the ninth memory cell MC9, the program operation may be performed with a lower intensity on each of the second memory cell MC2, the sixth memory cell MC6 and the $10^{th}$ memory cell MCA.

Similarly, during the period in which the program voltage is applied to the word line, the second allowable voltage may be applied to a bit line coupled to each of the second memory cell MC2, the sixth memory cell MC6 and the $10^{th}$ memory cell MCA and the third allowable voltage higher than the second allowable voltage may be applied to a bit line coupled to each of the third memory cell MC3, the seventh memory cell MC7 and the $11^{th}$ memory cell MCB. In this case, since the potential difference between the program pulses applied to each of the third memory cell MC3, the seventh memory cell MC7 and the $11^{th}$ memory cell MCB is smaller than that between the program pulses applied to the second memory cell MC2, the sixth memory cell MC6 and the $10^{th}$ memory cell MCA, the program operation may be performed with a lower intensity on each of the third memory cell MC3, the seventh memory cell MC7 and the $11^{th}$ memory cell MCB.

The program operation on each of the fourth memory cell MC4, the eighth memory cell MC8 and the $12^{th}$ memory cell MCC may be restricted. For example, while the program pulses are applied to the word line, the inhibiting voltage may be applied to a bit line coupled to each of the fourth memory cell MC4, the eighth memory cell MC8 and the $12^{th}$ memory cell MCC. In this case, since the potential difference between the program pulses applied to each of the fourth memory cell MC4, the eighth memory cell MC8 and the $12^{th}$ memory cell MCC becomes smaller than the potential difference for raising a threshold voltage of the memory cell, the program operation for raising the threshold voltage of each of the fourth memory cell MC4, the eighth memory cell MC8 and the $12^{th}$ memory cell MCC may be restricted.

According to an embodiment, the first allowable voltage may have a ground voltage VSS level or a negative voltage level lower than the ground voltage VSS level. The second allowable voltage may have a level higher than the ground voltage VSS level, for example, a 0.25 V level. The third allowable voltage may have a higher level than the second allowable voltage, for example, a 0.5 V level. The inhibiting voltage may have a power source voltage VCORE level, for example, a 1.8 V level.

According to an embodiment, in the first program loop PL1 among the plurality of program loops PL1 to PLn, a verification operation of verifying four program states by using three first verification voltages PVT1, PVP1 and PVM1 for checking the first program state PROGRAM1 after the program operation is performed may be performed. In this case, the state modes of the memory cell having the second program state PROGRAM2 and the third program state PROGRAM3 as the target program states may also be classified according to four types of state modes for the first program state PROGRAM1.

Subsequently, in the second program loop PL2, a verification operation of verifying four program states using the three first verification voltages PVT1, PVP1 and PVM1 for checking the first program state PROGRAM1 and four program states using the three second verification voltages PVT2, PVP2 and PVM2 for checking the second program state PROGRAM2 may be performed after the program operation is performed. In this case, the memory cells having the first program state PROGRAM1 as the target program state may be classified according to four types of state modes for the first program state PROGRAM1, and the memory cells having the second program state PROGRAM2 and the third program state PROGRAM3 as the target program states may be classified according to four types of state modes for the second program state PROGRAM2.

Subsequently, in the third program loop PL3, a verification operation of verifying four program states using the three first verification voltages PVT1, PVP1 and PVM1 for checking the first program state PROGRAM1, four program states using the three second verification voltages PVT2, PVP2 and PVM2 for checking the second program state PROGRAM2 and four program states using the three third verification voltages PVT3, PVP3 and PVM3 for checking the third program state PROGRAM3 may be performed after the program operation is performed. In this case, the memory cells having the first program state PROGRAM1 as the target program state may be classified according to four types of state modes for the first program state PROGRAM1, the memory cells having the second program state PROGRAM2 as the target program state may be classified according to four types of state modes for the second program state PROGRAM2, and the memory cells having the third program state PROGRAM3 as the target program state may be classified according to four types of state modes for the third program state PROGRAM3.

When it is checked that all of the memory cells each having the first program state PROGRAM1 as the target program state have reached the first program state PROGRAM1 through the first to third program loops PL1 to PL3, a verification operation of verifying four program states using the three second verification voltages PVT2, PVP2 and PVM2 for checking the second program state PROGRAM2 and four program states using the three third verification voltages PVT3, PVP3 and PVM3 for checking the third program state PROGRAM3 may be performed after the program operation is performed, in the subsequent fourth program loop PL4. In this case, all the memory cells each having the first program state PROGRAM1 as the target program state may be classified as the inhibiting mode, the memory cells each having the second program state PROGRAM2 as the target program state may be classified according to the four types of state modes for the second program state PROGRAM2, the memory cells each having the third program state PROGRAM3 as the target program state may be classified according to the four types of state modes for the third program state PROGRAM3.

Figure 9:
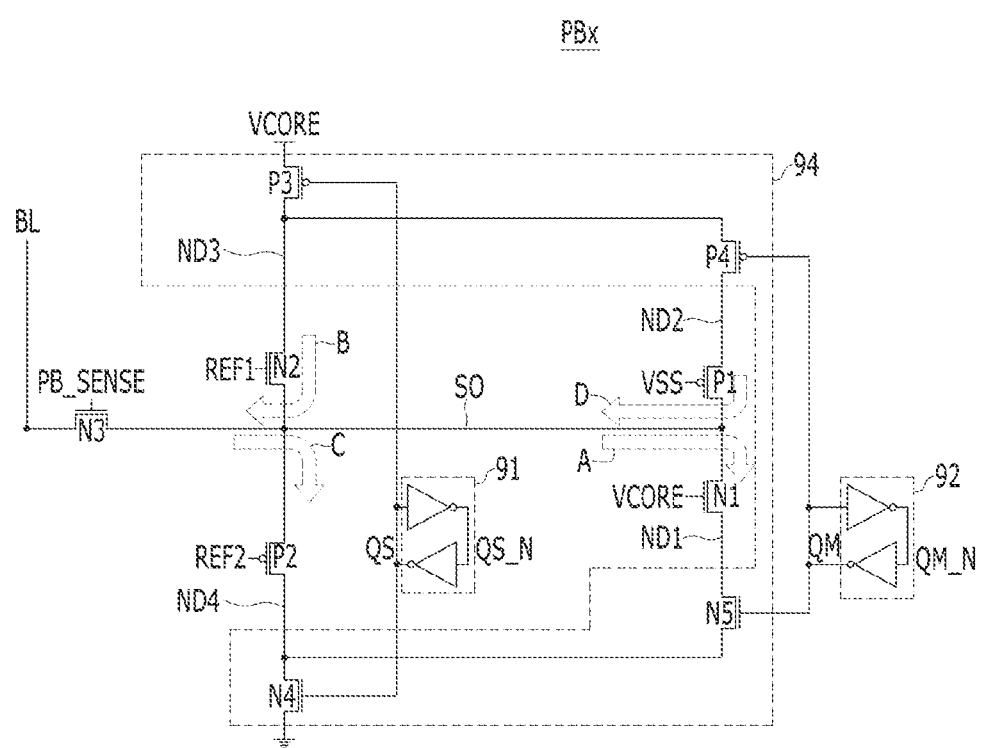
FIG. 9 is a diagram illustrating a configuration of a page buffer circuit in accordance with a first embodiment.

FIG. 9 is a diagram illustrating a configuration of a page buffer circuit in accordance with a first embodiment.

Referring to FIG. 9, a page buffer PBx is a circuit diagram illustrating any one of the plurality of page buffers PB1 to PBm described with reference to FIG. 2. Each PBx of the plurality of page buffers PB1 to PBm may include M latches. Herein, "M" may be a natural number equal to or greater than 2. In the drawing, it may be seen that each PBx of the plurality of page buffers PB1 to PBm includes two latches 91 and 92, on the assumption that "M" is 2.

The control circuit 152 described with reference to FIGS. 2 and 4 may input N types of M-bit setting codes to the M latches included in each PBx of the plurality of page buffers PB1 to PBm and generate N types of column voltages, during the bit line setup operation. On the assumption that "N" is 4 and "M" is 2, the control circuit 152 may input four types of 2-bit setting codes to the two latches 91 and 92 included in each PBx of the plurality of page buffers PB1 to PBm and generate four types of column voltages A, B, C and D, during the bit line setup operation. According to an embodiment, the M square root of N may be set to have a value of 2 or more.

That is, when values of a plurality of M-bit setting codes corresponding to the plurality of bit lines are determined according to a result of verifying the N types of program states for each of the plurality of memory cells included in the selected word line in order to check one target program state in the verification operation of the first program loop performed first, the control circuit 152 may input the values of the M-bit setting codes, which are determined in the first program loop, to the M latches included in each PBx of the plurality of page buffers PB1 to PBm, generate the plurality of column voltages, and then apply the plurality of column voltages to each PBx of the plurality of page buffers PB1 to PBm, during the bit line setup operation of the second program loop performed subsequent to the first program loop. Each of the plurality of column voltages may be one of N types of column voltages.

For reference, the outside of the control circuit 152, for example, the control logic 153, may check a result of the verification operation of the first program loop, determine the values of the plurality of M-bit setting codes as the check result, and then input the values of the plurality of M-bit setting codes to the control circuit 152. Of course, it may be possible for the control circuit 152 to determine the values of the plurality of M-bit setting codes by directly checking the result of the verification operation of the first program loop. Also, initial values of the plurality of M-bit setting codes, that is, a plurality of M-bit setting values that may be input in the program loop performed first may be predetermined according to the type or characteristics of the memory device.

According to an embodiment, on the assumption that "N" is 4 and "M" is 2, when a value of one specific 2-bit setting code corresponding to one bit line coupled to a specific memory cell is determined according to a result of verifying the 4 types of program states for the memory cell in the verification operation of the first program loop, the control circuit 152 may input the value of the 2-bit setting code to 2 latches included in one page buffer corresponding to the one bit line, generate one column voltage, and then apply the one column voltage to the one bit line, during the bit line setup operation of the second program loop performed subsequent to the first program loop. The one column voltage may be one of 4 types of column voltages.

The control logic 153 described with reference to FIGS. 2 and 4 may control the control circuit 152 to input the N types of M-bit setting codes to the M latches included in each PBx of the plurality of page buffers PB1 to PBm and generate the N types of column voltages in the bit line setup operation. In this case, the N types of M-bit setting codes may be included in the bit line control signal BL_Con transmitted from the control logic 153 to the control circuit 152. On the assumption that "N" is 4 and "M" is 2, the control logic 153 may control the control circuit 152 to input the four types of 2-bit setting codes to the two latches 91 and 92 included in each PBx of the plurality of page buffers PB1 to PBm and generate the four types of column voltages A, B, C and D, during the bit line setup operation.

That is, the control logic 153 may determine the values of the plurality of M-bit setting codes corresponding to the plurality of bit lines according to the result of verifying the N types of program states for each of the plurality of memory cells included in the selected word line in order to check one target program state in the verification operation of the first program loop performed first. In addition, the control logic 153 may control the control circuit 152 to input the values of the M-bit setting codes, which are determined in the first program loop, to the M latches included in each PBx of the plurality of page buffers PB1 to PBm, generate the plurality of column voltages, and then apply the plurality of column voltages to each of the plurality of bit lines, during the bit line setup operation of the second program loop performed subsequent to the first program loop. In this case, each of the plurality of column voltages may be one of N types of column voltages.

According to an embodiment, on the assumption that "N" is 8 and "M" is 3, the control logic 153 may determine a value of one 3-bit setting code corresponding to one bit line coupled to a specific memory cell according to a result of verifying the 8 types of program states for the memory cell in the verification operation of the first program loop. In addition, the control logic 153 may control the control circuit 152 to input the value of the 3-bit setting code to 3 latches included in one page buffer corresponding to the one bit line, generate one column voltage, and then apply the one column voltage to the one bit line, during the bit line setup operation of the second program loop performed subsequent to the first program loop. The one column voltage may be one of 8 types of column voltages.

Referring to FIG. 9, each PBx of the plurality of page buffers PB1 to PBm may include the M latches 91 and 92, a first NMOS transistor N1, a first PMOS transistor P1, (N/2)−1 second NMOS transistors N2, (N/2)−1 second PMOS transistors P2, a third NMOS transistor N3 and a coupling control unit 94. On the assumption that "N" is 4, each PBx of the plurality of page buffers PB1 to PBm may include two latches 91 and 92, one first NMOS transistor N1, one first PMOS transistor P1, one second NMOS transistor N2, one second PMOS transistor P2, one third NMOS transistor N3 and the coupling control unit 94.

The first NMOS transistor N1 may couple a sensing node SO to a first node ND1 in response to a power source voltage VCORE applied to a gate thereof.

The first PMOS transistor P1 may couple the sensing node SO to a second node ND2 in response to a ground voltage VSS applied to the gate thereof.

The (N/2)−1 second NMOS transistors N2 may couple the sensing node SO to (N/2)−1 third nodes ND3 in response to (N/2)−1 types of first reference voltages REF1, respectively. On the assumption that "N" is 4, one second NMOS transistor N2 may couple the sensing node SO to one third node ND3 in response to one type of first reference voltage REF1.

The (N/2)−1 second PMOS transistors P2 may couple the sensing node SO to (N/2)−1 fourth nodes ND4 in response to (N/2)−1 types of second reference voltages REF2, respectively. On the assumption that "N" is 4, one second PMOS transistor P2 may couple the sensing node SO to one fourth node ND4 in response to one type of second reference voltage REF2.

The third NMOS transistor N3 may couple the sensing node SO to a bit line BL in response to a voltage application signal PBSENSE.

The coupling control unit 94 may couple any one of the first to fourth nodes ND1, ND2, ND3 and ND4 to a power source voltage VCORE terminal or a ground voltage VSS terminal according to types of M-bit setting codes input to the M latches 91 and 92. On the assumption that "M" is 2, the coupling control unit 94 may couple at least one of the first to fourth nodes ND1, ND2, ND3 and ND4 to the power source voltage VCORE terminal or the ground voltage VSS terminal according to types 00, 01, 10 and 11 of 2-bit setting codes input to two latches 91 and 92.

Referring to FIGS. 2, 4 and 9, the control circuit 152 may generate the voltage application signal PBSENSE having a predetermined level higher than the power source voltage VCORE level in the bit line setup operation, and input the generated voltage application signal PBSENSE to the third NMOS transistor N3 included in each PBx of the plurality of page buffers PB1 to PBm. That is, the control circuit 152 may control each PBx of the plurality of page buffers PB1 to PBm to maintain the bit line BL and the sensing node SO in an electrically coupled state in the bit line setup operation. Accordingly, a voltage level loaded on the sensing node SO in the bit line setup operation may be transferred to the bit line BL without loss. In addition, the control circuit 152 may input a plurality of M-bit setting codes to the M latches 91 and 92 included in each PBx of the plurality of page buffers PB1 to PBm in the bit line set-up operation, and control the coupling control unit 94 to couple at least one of the first to fourth nodes ND1, ND2, ND3 and ND4 included in each PBx of the page buffers PB1 to PBm to the power source voltage VCORE terminal or the ground voltage VSS terminal.

Referring to FIGS. 2, 4 and 9, the control logic 153 may control the control circuit 152 to generate the voltage application signal PBSENSE having a predetermined level higher than the power source voltage VCORE level in the bit line setup operation and input the generated voltage application signal PBSENSE to the third NMOS transistor N3 included in each PBx of the plurality of page buffers PB1 to PBm. That is, the control logic 153 may control the control circuit 152 to allow each PBx of the plurality of page buffers PB1 to PBm to maintain the bit line BL and the sensing node SO in an electrically coupled state in the bit line setup operation. Accordingly, a voltage level loaded on the sensing node SO in the bit line setup operation may be transferred to the bit line BL without loss. In addition, the control logic 153 may control the control circuit 152 to input a plurality of M-bit setting codes to the M latches 91 and 92 included in each PBx of the plurality of page buffers PB1 to PBm in the bit line set-up operation and couple at least one of the first to fourth nodes ND1, ND2, ND3 and ND4 included in each PBx of the page buffers PB1 to PBm to the power source voltage VCORE terminal or the ground voltage VSS terminal through the coupling control unit 94.

More specifically, referring to FIG. 9, the coupling control unit 94 may couple the ground voltage VSS terminal to the first node ND1 in response to a first setting code, among N types of M bit setting codes, being input to the M latches 91 and 92 included in each PBx of the plurality of page buffers PB1 to PBm, thereby controlling a first column voltage A having the ground voltage VSS level to be loaded on the sensing node SO through the first NMOS transistor N1. According to an embodiment, on the assumption that "N" is 4 and "M" is 2, when the first setting code having a value of "00" is applied to respective input terminals QS_N and QM_N of the two latches 91 and 92, and values of respective output terminals QS and QM of the two latches 91 and 92 are "11", the two NMOS transistors N4 and N5 included in the coupling control unit 94 may be turned on, the two PMOS transistors P3 and P4 included in the coupling control unit 94 may be turned off, and thus the first node ND1 may be coupled to the ground voltage VSS terminal. Since the first NMOS transistor N1 coupled between the first node ND1 and the sensing node SO is turned on in response to the power source voltage VCORE applied to the gate thereof, the first column voltage A having the ground voltage VSS level may be loaded on the sensing node SO.

The coupling control unit 94 may couple the power source voltage VCORE terminal to the second node ND2 in response to a second setting code, among the N types of M bit setting codes, being input to the M latches 91 and 92 included in each PBx of the plurality of page buffers PB1 to PBm, thereby controlling a second column voltage D having the power source voltage VCORE level to be loaded on the sensing node SO through the first PMOS transistor P1. According to an embodiment, on the assumption that "N" is 4 and "M" is 2, when the second setting code having a value of "11" is applied to the respective input terminals QS_N and QM_N of the two latches 91 and 92, and the values of the respective output terminals QS and QM of the two latches 91 and 92 are "00", the two NMOS transistors N4 and N5 included in the coupling control unit 94 may be turned off, the two PMOS transistors P3 and P4 included in the coupling control unit 94 may be turned on, and thus the second node ND2 may be coupled to the power source voltage VCORE terminal. Since the first PMOS transistor P1 coupled between the second node ND2 and the sensing node SO is turned on in response to the ground voltage VSS applied to the gate thereof, the second column voltage D having the power source voltage VCORE level may be loaded on the sensing node SO.

The coupling control unit 94 may couple the power source voltage VCORE terminal to the third node ND3 in response to each of (N/2)−1 types of third setting codes, among the N types of M bit setting codes, being input to the M latches 91 and 92 included in each PBx of the plurality of page buffers PB1 to PBm, thereby controlling (N/2)−1 types of third column voltages B having sequential levels between the power source voltage VCORE level and the ground voltage VSS level to be loaded on the sensing node SO through an NMOS clamping method in the second NMOS transistor N2. According to an embodiment, on the assumption that "N" is 4 and "M" is 2, when the third setting code having a value of "10" is applied to the respective input terminals QS_N and QM_N of the two latches 91 and 92, and the values of the respective output terminals QS and QM of the two latches 91 and 92 are "01", one PMOS transistor P3 and one NMOS transistor N5 included in the coupling control unit 94 may be turned on, one PMOS transistor P4 and one NMOS transistor N4 included in the coupling control unit 94 may be turned off, and thus the third node ND3 may be coupled to the power source voltage VCORE terminal. The second NMOS transistor N2 coupled between the third node ND3 and the sensing node SO may determine a level of the third column voltage B, which is precharged to the sensing node SO through the NMOS clamping method from the power source voltage VCORE level, in response to the first reference voltage REF1 applied to the gate thereof. At this time, the NMOS clamping may occur because the level of the first reference voltage REF1 applied to the gate of the second NMOS transistor N2 is not higher than the level of the power source voltage VCORE coupled to a drain thereof by a threshold voltage level. The level of the third column voltage B may be a level obtained by subtracting the threshold voltage level of the second NMOS transistor N2 from the level of the first reference voltage REF1. For example, on the assumption that the level of the power source voltage VCORE is 1.8 V, the level of the first reference voltage REF1 is 1.25 V, and the level of the threshold voltage of the second NMOS transistor N2 is 1 V, the level of the third column voltage B may be 0.25 V.

The coupling control unit 94 may couple the ground voltage VSS terminal to each of (N/2)−1 fourth nodes ND4 in response to each of (N/2)−1 types of fourth setting codes, which does not overlap the third setting code among the N types of M bit setting codes and are input to the M latches 91 and 92 included in each PBx of the plurality of page buffers PB1 to PBm, thereby controlling (N/2)−1 types of fourth column voltages C, which have sequential levels between the power source voltage VCORE level and the ground voltage VSS level and are higher than the third column voltage B, to be loaded on the sensing node SO through a PMOS clamping method in the second PMOS transistor P2.

According to an embodiment, on the assumption that "N" is 4 and "M" is 2, when the third setting code having a value of "01" is applied to the respective input terminals QS_N and QM_N of the two latches 91 and 92, and the values of the respective output terminals QS and QM of the two latches 91 and 92 are "10", one PMOS transistor P4 and one NMOS transistor N4 included in the coupling control unit 94 may be turned on, one PMOS transistor P3 and one NMOS transistor N5 included in the coupling control unit 94 may be turned off, and thus the fourth node ND4 may be coupled to the ground voltage VSS terminal. The second PMOS transistor P2 coupled between the fourth node ND4 and the sensing node SO may determine a level of the fourth column voltage C, which is discharged in the sensing node SO through the PMOS clamping method from the ground voltage VSS level, in response to the second reference voltage REF2 applied to the gate thereof. At this time, the PMOS clamping may occur because the level of the second reference voltage REF2 applied to the gate of the second PMOS transistor P2 is not lower than the level of the ground voltage VSS coupled to a drain thereof by a threshold voltage level. The level of the fourth column voltage C may be a level obtained by adding the threshold voltage level of the second PMOS transistor P2 to the level of the second reference voltage REF2. For example, on the assumption that the level of the ground voltage VSS is 0 V, the level of the second reference voltage REF2 is −0.5 V, and the threshold voltage level of the third PMOS transistor P2 is 1 V, the level of the fourth column voltage C may be 0.5 V.

Figure 10:
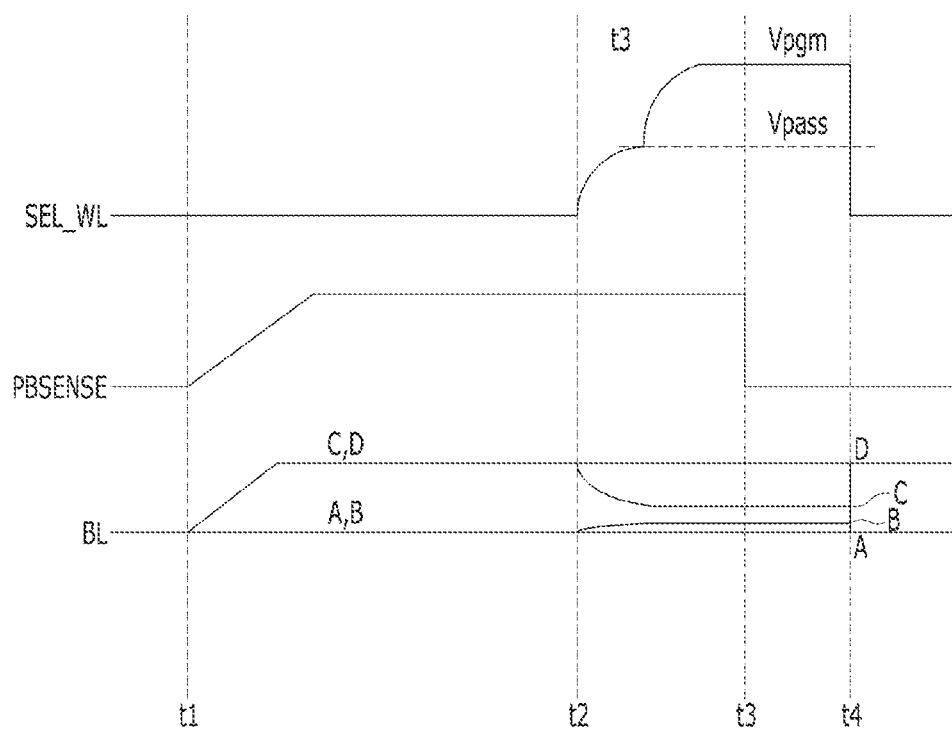
FIG. 10 is a diagram illustrating an operation of the page buffer circuit illustrated in FIG. 9 in accordance with the first embodiment.

FIG. 10 is a diagram illustrating an operation of the page buffer illustrated in FIG. 9 in accordance with the first embodiment.

Referring to FIG. 10, a program operation included in a program loop may include a bit line setup operation t1 to t3 and a program voltage application operation t2 to t4.

In the bit line setup operation, the N types of M-bit setting codes may be input to the M latches included in each PBx of the plurality of page buffers PB1 to PBm, and the N types of column voltages A, B, C and D may be generated. The generated N types of column voltages A, B, C and D may be selectively applied to each of bit lines coupled to memory cells of a selected word line selected as a program target among a plurality of word lines.

According to an embodiment, the second column voltage D, which is the highest voltage among the N types of column voltages A, B, C and D and has the power source voltage VCORE level, may be applied, as an inhibiting voltage, to a bit line coupled to a program inhibited cell among the plurality of memory cells included in the selected word line. The first column voltage A, which is the lowest voltage among the N types of column voltages A, B, C and D and has the ground voltage VSS level, may be applied, as a first allowable voltage, to a bit line coupled to a first cell having a threshold voltage lower than the additional verification voltage PVT among the plurality of memory cells included in the selected word line. The third column voltage B, which is the third highest voltage among the N types of column voltages A, B, C and D, may be applied, as a second allowable voltage, to a bit line coupled to a second cell having a threshold voltage higher than the additional verification voltage PVT and lower than the pre-verification voltage PVP among the plurality of memory cells included in the selected word line. The fourth column voltage C, which is the second highest voltage among the N types of column voltages A, B, C and D, may be applied, as a third allowable voltage, to a bit line coupled to a third cell having a threshold voltage higher than the pre-verification voltage PVP and lower than the main verification voltage PVM among the plurality of memory cells included in the selected word line.

As described above, any one of the N types of column voltages A, B, C and D may be applied to each of the plurality of bit lines through the bit line setup operation, and then the program voltage may be applied to the selected word line through the program voltage application operation. Accordingly, in the program voltage application operation, the intensity of the program operation on the third cell may be lower than that of the program operation on the second cell. At the same time, the intensity of the program operation on the second cell may be lower than that of the program operation on the first cell. Of course, the program operation on the program inhibited cell may be restricted.

Figure 11:
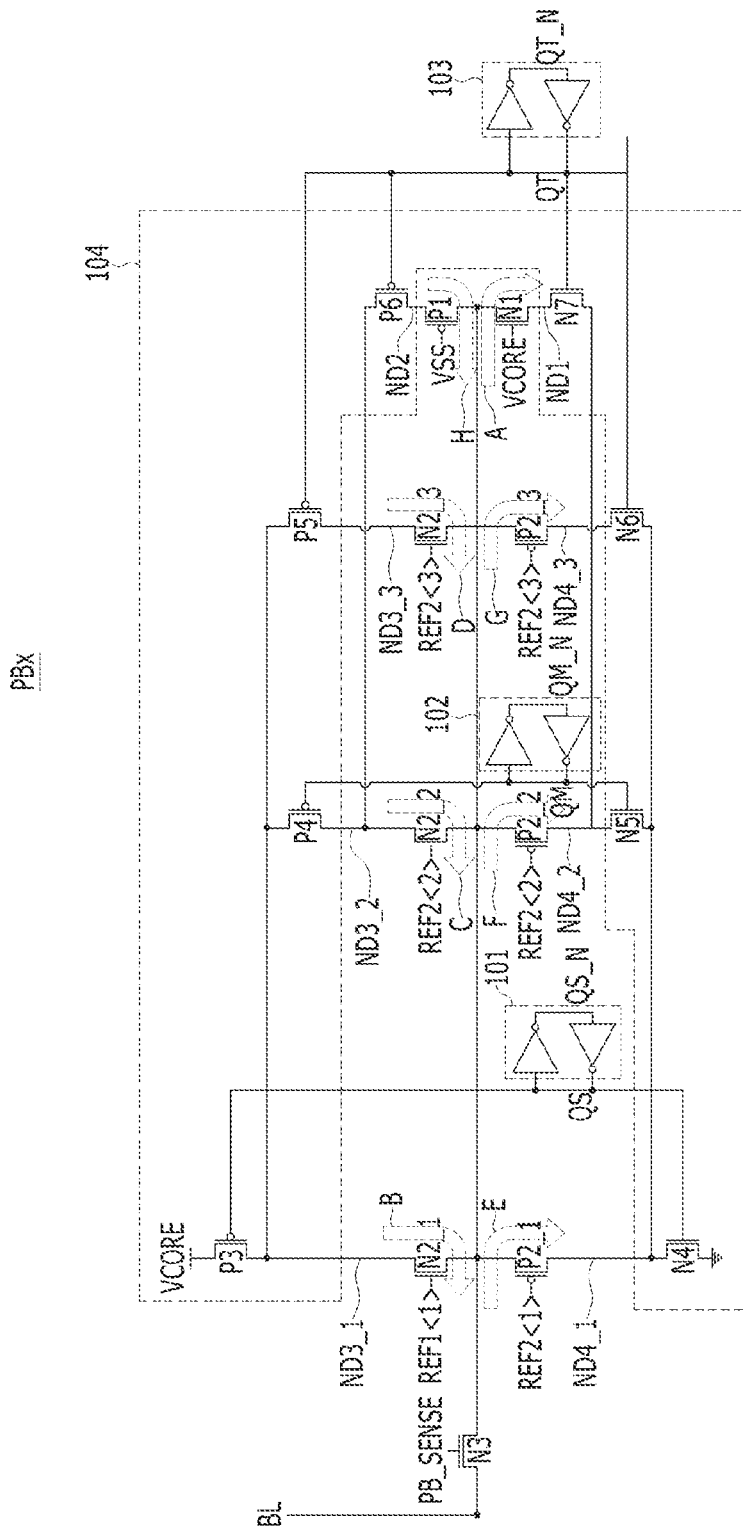
FIG. 11 is a diagram illustrating a configuration of a page buffer circuit in accordance with a second embodiment.

FIG. 11 is a diagram illustrating a configuration of a page buffer circuit in accordance with a second embodiment.

Referring to FIG. 11, the page buffer PBx is a circuit diagram illustrating any one of the plurality of page buffers PB1 to PBm described with reference to FIG. 2. Each PBx of the plurality of page buffers PB1 to PBm may include M latches. Herein, "M" may be a natural number equal to or greater than 2. In the drawing, it may be seen that each PBx of the plurality of page buffers PB1 to PBm includes three latches 101, 102 and 103 on the assumption that "M" is 3.

Comparing the configuration of the page buffer circuit according to the first embodiment disclosed in FIG. 9 and the configuration of the page buffer circuit according to the second embodiment disclosed in FIG. 11, it may be seen that FIG. 9 illustrates the configuration of the page buffer circuit designed on the assumption that "N" is 4 and "M" is 2, whereas FIG. 11 illustrates the configuration of the page buffer circuit designed on the assumption that "N" is 8 and "M" is 3.

Accordingly, the operation of the page buffer circuit according to the second embodiment disclosed in FIG. 11 is almost the same as that of the page buffer circuit according to the first embodiment described with reference to FIG. 9. Hereinafter, differences between the configuration of the page buffer circuit according to the first embodiment disclosed in FIG. 9 and the configuration of the page buffer circuit according to the second embodiment disclosed in FIG. 11 are described.

Referring to FIG. 11, each PBx of the plurality of page buffers PB1 to PBm may include the M latches 101, 102 and 103, a first NMOS transistor N1, a first PMOS transistor P1, (N/2)−1 second NMOS transistors N2_1, N2_2 and N2_3, (N/2)−1 second PMOS transistors P2_1, P2_2 and P2_3, a third NMOS transistor N3 and a coupling control unit 104. On the assumption that "N" is 8 and "M" is 3, each PBx of the plurality of page buffers PB1 to PBm may include three latches 101, 102 and 103, one first NMOS transistor N1, one first PMOS transistors P1, three second NMOS transistors N2_1, N2_2 and N2_3, three second PMOS transistors P2_1, P2_2 and P2_3, one third NMOS transistor N3 and the coupling control unit 104.

The first NMOS transistor N1 may couple a sensing node SO to a first node ND1 in response to a power source voltage VCORE applied to a gate thereof.

The first PMOS transistor P1 may couple the sensing node SO to a second node ND2 in response to a ground voltage VSS applied to the gate thereof.

The (N/2)−1 second NMOS transistors N2_1, N2_2 and N2_3 may couple the sensing node SO to (N/2)−1 third nodes ND3_1, ND3_2 and ND3_3 in response to (N/2)−1 types of first reference voltages REF1<1:3>, respectively. On the assumption that "N" is 8 and "M" is 3, three second NMOS transistors N2_1, N2_2 and N2_3 may couple the sensing node SO to three third nodes ND3_1, ND3_2 and ND3_3 in response to three types of first reference voltages REF1<1:3>.

The (N/2)−1 second PMOS transistors P2_1, P2_2 and P2_3 may couple the sensing node SO to (N/2)−1 fourth nodes ND4_1, ND4_2 and ND4_3 in response to (N/2)−1 types of second reference voltages REF2<1:3>, respectively. On the assumption that "N" is 8 and "M" is 3, three second PMOS transistors P2_1, P2_2 and P2_3 may couple the sensing node SO to three fourth nodes ND4_1, ND4_2 and ND4_3 in response to three types of second reference voltages REF2<1:3>.

The third NMOS transistor N3 may couple the sensing node SO to a bit line BL in response to a voltage application signal PBSENSE.

The coupling control unit 104 may couple any one of the first to fourth nodes ND1, ND2, ND3 and ND4 to a power source voltage VCORE terminal or a ground voltage VSS terminal according to types of M-bit setting codes input to the M latches 101, 102 and 103. On the assumption that "N" is 8 and "M" is 3, the coupling control unit 104 may couple at least one of first to fourth nodes ND1, ND2, ND3_1, ND3_2, ND3_3, ND4_1, ND4_2 and ND4_3 to the power source voltage VCORE terminal or the ground voltage VSS terminal according to types 000, 001, 010, 011, 100, 101, 110 and 111 of 3-bit setting codes input to the three latches 101, 102 and 103.

More specifically, referring to FIG. 11, the coupling control unit 104 may couple the ground voltage VSS terminal to the first node ND1 in response to a first setting code, among N types of M bit setting codes, being input to the M latches 101, 102 and 103 included in each PBx of the plurality of page buffers PB1 to PBm, thereby controlling a first column voltage A having the ground voltage VSS level to be loaded on the sensing node SO through the first NMOS transistor N1. According to an embodiment, on the assumption that "N" is 8 and "M" is 3, when the first setting code having a value of "000" is applied to respective input terminals QS_N, QM_N and QT_N of the three latches 101, 102 and 103, and values of respective output terminals QS, QM and QT of the three latches 101, 102 and 103 are "111", the four NMOS transistors N4, N5, N6 and N7 included in the coupling control unit 104 may be turned on, the four PMOS transistors P3, P4, P5 and P6 included in the coupling control unit 104 may be turned off, and thus the first node ND1 may be coupled to the ground voltage VSS terminal. Since the first NMOS transistor N1 coupled between the first node ND1 and the sensing node SO is turned on in response to the power source voltage VCORE applied to the gate thereof, the first column voltage A having the ground voltage VSS level may be loaded on the sensing node SO.

The coupling control unit 104 may couple the power source voltage VCORE terminal to the second node ND2 in response to a second setting code, among the N types of M bit setting codes, being input to the M latches 101, 102 and 103 included in each PBx of the plurality of page buffers PB1 to PBm, thereby controlling a second column voltage H having the power source voltage VCORE level to be loaded on the sensing node SO through the first PMOS transistor P1. According to an embodiment, on the assumption that "N" is 8 and "M" is 3, when the second setting code having a value of "111" is applied to the respective input terminals QS_N, QM_N and QT_N of the three latches 101, 102 and 103, and the values of the respective output terminals QS, QM and QT of the three latches 101, 102 and 103 are "000", the four NMOS transistors N4, N5, N6 and N7 included in the coupling control unit 104 may be turned off, the four PMOS transistors P3, P4, P5 and P6 included in the coupling control unit 104 may be turned on, and thus the second node ND2 may be coupled to the power source voltage VCORE terminal. Since the first PMOS transistor P1 coupled between the second node ND2 and the sensing node SO is turned on in response to the ground voltage VSS applied to the gate thereof, the second column voltage H having the power source voltage VCORE level may be loaded on the sensing node SO.

The coupling control unit 104 may couple the power source voltage VCORE terminal to the (N/2)−1 type of third nodes ND3_1, ND3_2 and ND3_3 in response to (N/2)−1 types of third setting codes, respectively, among the N types of M bit setting codes, being input to the M latches 101, 102 and 103 included in each PBx of the plurality of page buffers PB1 to PBm, thereby controlling (N/2)−1 types of third column voltages B, C and D having sequential levels between the power source voltage VCORE level and the ground voltage VSS level to be loaded on the sensing node SO through an NMOS clamping method in the second NMOS transistor N2.

According to an embodiment, on the assumption that "N" is 8 and "M" is 3, when the third setting code having a value of "100" is applied to the respective input terminals QS_N, QM_N and QT_N of the three latches 101, 102 and 103, and the values of the respective output terminals QS, QM and QT of the three latches 101, 102 and 103 are "011", one PMOS transistor P3 and three NMOS transistors N5, N6 and N7 included in the coupling control unit 104 may be turned on, three PMOS transistors P4, P5 and P6 and one NMOS transistor N4 included in the coupling control unit 104 may be turned off, and thus the first third node ND3_1 may be coupled to the power source voltage VCORE terminal. The first second NMOS transistor N2_1 coupled between the first third node ND3_1 and the sensing node SO may determine a level of the first third column voltage B, which is precharged to the sensing node SO through the NMOS clamping method from the power source voltage VCORE level, in response to the first reference voltage REF1<1> applied to the gate thereof. At this time, the NMOS clamping may occur because the level of the first first reference voltage REF1<1> applied to the gate of the first second NMOS transistor N2_1 is not higher than the level of the power source voltage VCORE coupled to a drain thereof by a threshold voltage level. The level of the first third column voltage B may be a level obtained by subtracting the threshold voltage level of the first second NMOS transistor N2_1 from the level of the first first reference voltage REF1<1>. For example, on the assumption that the level of the power source voltage VCORE is 1.8 V, the level of the first first reference voltage REF1<1> is 1 V, and the threshold voltage level of the first second NMOS transistor N2_1 is 0.7 V, the level of the first third column voltage B may be 0.3 V.

According to an embodiment, on the assumption that "N" is 8 and "M" is 3, when the third setting code having a value of "110" is applied to the respective input terminals QS_N, QM_N and QT_N of the three latches 101, 102 and 103, and the values of the respective output terminals QS, QM and QT of the three latches 101, 102 and 103 are "001", two PMOS transistors P3 and P4 and two NMOS transistors N6 and N7 included in the coupling control unit 104 may be turned on, two PMOS transistors P5 and P6 and two NMOS transistors N4 and N5 included in the coupling control unit 104 may be turned off, and thus the first and second third nodes ND3_1 and ND3_2 may be coupled to the power source voltage VCORE terminal. The first and second second NMOS transistors N2_1 and N2_2 coupled between the first and second third nodes ND3_1 and ND3_2 and the sensing node SO may determine a level of the second third column voltage C, which is precharged to the sensing node SO through the NMOS clamping method from the power source voltage VCORE level, in response to the first and second first reference voltages REF1<1:2> applied to the gates thereof. At this time, the NMOS clamping may occur because the levels of the first and second first reference voltages REF1<1:2> applied to the gates of the first and second second NMOS transistors N2_1 and N2_2 are not higher than the level of the power source voltage VCORE coupled to drains thereof by a threshold voltage level. The level of the second third column voltage C may be a relatively higher level between a level obtained by subtracting the threshold voltage level of the first second NMOS transistor N2_1 from the level of the first first reference voltage REF1<1> and a level obtained by subtracting the threshold voltage level of the second second NMOS transistor N2_2 from the level of the second first reference voltage REF1<2>. For example, on the assumption that the level of the power source voltage VCORE is 1.8 V, the level of the first first reference voltage REF1<1> is 1 V, the level of the second first reference voltage REF1<2> is 1.1 V and the threshold voltage level of each of the first and second second NMOS transistors N2_1 and N2_2 is 0.7 V, the level of the second third column voltage C may be 0.4V determined in the second second NMOS transistor N2_2.

According to an embodiment, on the assumption that "N" is 8 and "M" is 3, when the third setting code having a value of "101" is applied to the respective input terminals QS_N, QM_N and QT_N of the three latches 101, 102 and 103, and the values of the respective output terminals QS, QM and QT of the three latches 101, 102 and 103 are "010", three PMOS transistors P3, P5 and P6 and one NMOS transistor N5 included in the coupling control unit 104 may be turned on, one PMOS transistors P4 and three NMOS transistors N4, N6 and N7 included in the coupling control unit 104 may be turned off, and thus the first and third third nodes ND3_1 and ND3_3 may be coupled to the power source voltage VCORE terminal. The first and third second NMOS transistors N2_1 and N2_3 coupled between the first and third third nodes ND3_1 and ND3_3 and the sensing node SO may determine a level of the third third column voltage D, which is precharged to the sensing node SO through the NMOS clamping method from the power source voltage VCORE level, in response to the first and third first reference voltages REF1<1,3> applied to the gates thereof. At this time, the NMOS clamping may occur because the levels of the first and third first reference voltages REF1<1,3> applied to the gates of the first and third second NMOS transistors N2_1 and N2_3 are not higher than the level of the power source voltage VCORE coupled to drains thereof by a threshold voltage level. The level of the third third column voltage D may be a relatively higher level between a level obtained by subtracting the threshold voltage level of the first second NMOS transistor N2_1 from the level of the first first reference voltage REF1<1> and a level obtained by subtracting the threshold voltage level of the third second NMOS transistor N2_3 from the level of the third first reference voltage REF1<3>. For example, on the assumption that the level of the power source voltage VCORE is 1.8 V, the level of the first first reference voltage REF1<1> is 1 V, the level of the third first reference voltage REF1<3> is 1.2 V and the threshold voltage levels of the first and third second NMOS transistors N2_1 and N2_3 are 0.7 V, the level of the third third column voltage D may be 0.5 V determined in the third second NMOS transistor N2_3.

The coupling control unit 104 may couple the ground voltage VSS terminal to (N/2)−1 fourth nodes ND4_1, ND4_2 and ND4_3 respectively in response to (N/2)−1 types of fourth setting codes, which does not overlap the third setting code among the N types of M bit setting codes and is input to the M latches 101, 102 and 103 included in each PBx of the plurality of page buffers PB1 to PBm, thereby controlling (N/2)−1 types of fourth column voltages C having sequential levels between the power source voltage VCORE level and the ground voltage VSS level and having higher levels than the third column voltage B to be loaded on the sensing node SO through a PMOS clamping method in the second PMOS transistors P2_1, P2_2 and P2_3.

According to an embodiment, on the assumption that "N" is 8 and "M" is 3, when the third setting code having a value of "011" is applied to the respective input terminals QS_N, QM_N and QT_N of the three latches 101, 102 and 103, and the values of the respective output terminals QS, QM and QT of the three latches 101, 102 and 103 are "100", three PMOS transistors P4, P5 and P6 and one NMOS transistor N4 included in the coupling control unit 104 may be turned on, one PMOS transistor P3 and three NMOS transistors N5, N6 and N7 in the coupling control unit 104 may be turned off, and thus the first fourth node ND4_1 may be coupled to the ground voltage VSS terminal. The first second PMOS transistor P2_1 coupled between the first fourth node ND4_1 and the sensing node SO may determine a level of the first fourth column voltage E, which is discharged in the sensing node SO through the PMOS clamping method from the ground voltage VSS level, in response to the first second reference voltage REF2<1> applied to the gate thereof. At this time, the PMOS clamping may occur because the level of the first second reference voltage REF2<1> applied to the gate of the first second PMOS transistor P2_1 is not lower than the level of the ground voltage VSS coupled to a drain thereof by a threshold voltage level. The level of the first fourth column voltage E may be a level obtained by adding the threshold voltage level of the first second PMOS transistor P2_1 to the level of the first second reference voltage REF2<1>. For example, on the assumption that the level of the ground voltage VSS is 0 V, the level of the first second reference voltage REF2<1> is 0.1 V, and the threshold voltage level of the first third PMOS transistor P2_1 is 0.7 V, the level of the first fourth column voltage E may be 0.8 V.

According to an embodiment, on the assumption that "N" is 8 and "M" is 3, when the third setting code having a value of "001" is applied to the respective input terminals QS_N, QM_N and QT_N of the three latches 101, 102 and 103, and the values of the respective output terminals QS, QM and QT of the three latches 101, 102 and 103 are "110", two PMOS transistors P5 and P6 and two NMOS transistors N4 and N5 included in the coupling control unit 104 may be turned on, two PMOS transistors P3 and P4 and two NMOS transistors N6 and N7 included in the coupling control unit 104 may be turned off, and thus the first and second fourth nodes ND4_1 and ND4_2 may be coupled to the ground voltage VSS terminal. The first and second second PMOS transistors P2_1 and P2_2 coupled between the first and second fourth nodes ND4_1 and ND4_2 and the sensing node SO may determine a level of the second fourth column voltage F, which is discharged in the sensing node SO through the PMOS clamping method from the ground voltage VSS level, in response to the first and second second reference voltages REF2<1:2> applied to the gates thereof. At this time, the PMOS clamping may occur because the levels of the first and second second reference voltages REF2<1:2> applied to the gates of the first and second second PMOS transistors P2_1 and P2_2 are not lower than the level of the ground voltage VSS coupled to drain thereof by a threshold voltage level. The level of the second fourth column voltage F may be a relatively higher level between a level obtained by adding the threshold voltage level of the first second PMOS transistor P2_1 to the level of the first second reference voltage REF2<1> and a level obtained by adding the threshold voltage level of the second second PMOS transistor P2_2 to the level of the second second reference voltage REF2<2>. For example, on the assumption that the level of the ground voltage VSS is 0 V, the level of the first second reference voltage REF2<1> is 0.1 V, the level of the second second reference voltage REF2<2> is 0.2 V and the threshold voltage level of each of the first and second second PMOS transistors P2_1 and P2_2 is 0.7 V, the level of the second fourth column voltage F may be 0.9 V determined in the second second PMOS transistor P2_2.

According to an embodiment, on the assumption that "N" is 8 and "M" is 3, when the third setting code having a value of "010" is applied to the respective input terminals QS_N, QM_N and QT_N of the three latches 101, 102 and 103, and the values of the respective output terminals QS, QM and QT of the three latches 101, 102 and 103 are "101", one PMOS transistor P4 and three NMOS transistors N4, N6 and N7 included in the coupling control unit 104 may be turned on, three PMOS transistors P3, P5 and P6 and one NMOS transistor N5 included in the coupling control unit 104 may be turned off, and thus the first and third fourth nodes ND4_1 and ND4_3 may be coupled to the ground voltage VSS terminal. The first and third second PMOS transistors P2_1 and P2_3 coupled between the first and third fourth nodes ND4_1 and ND4_3 and the sensing node SO may determine a level of the third fourth column voltage G, which is discharged in the sensing node SO through the PMOS clamping method from the ground voltage VSS level, in response to the first and third second reference voltages REF2<1,3> applied to the gates thereof. At this time, the PMOS clamping may occur because the levels of the first and third second reference voltages REF2<1,3> applied to the gates of the first and third second PMOS transistors P2_1 and P2_3 are not lower than the level of the ground voltage VSS coupled to drains thereof by a threshold voltage level. The level of the third fourth column voltage G may be a relatively higher level between a level obtained by adding the threshold voltage level of the first second PMOS transistor P2_1 to the level of the first second reference voltage REF2<1> and a level obtained by adding the threshold voltage level of the third second PMOS transistor P2_3 to the level of the third second reference voltage REF2<3>. For example, on the assumption that the level of the ground voltage VSS is 0 V, the level of the first second reference voltage REF2<1> is 0.1 V, the level of the third second reference voltage REF2<3> is 0.3 V and the threshold voltage level of each of the first and third second PMOS transistors P2_1 and P2_3 is 0.7 V, the level of the third fourth column voltage G may be 1 V determined in the third second PMOS transistor P2_3.

Figure 12:
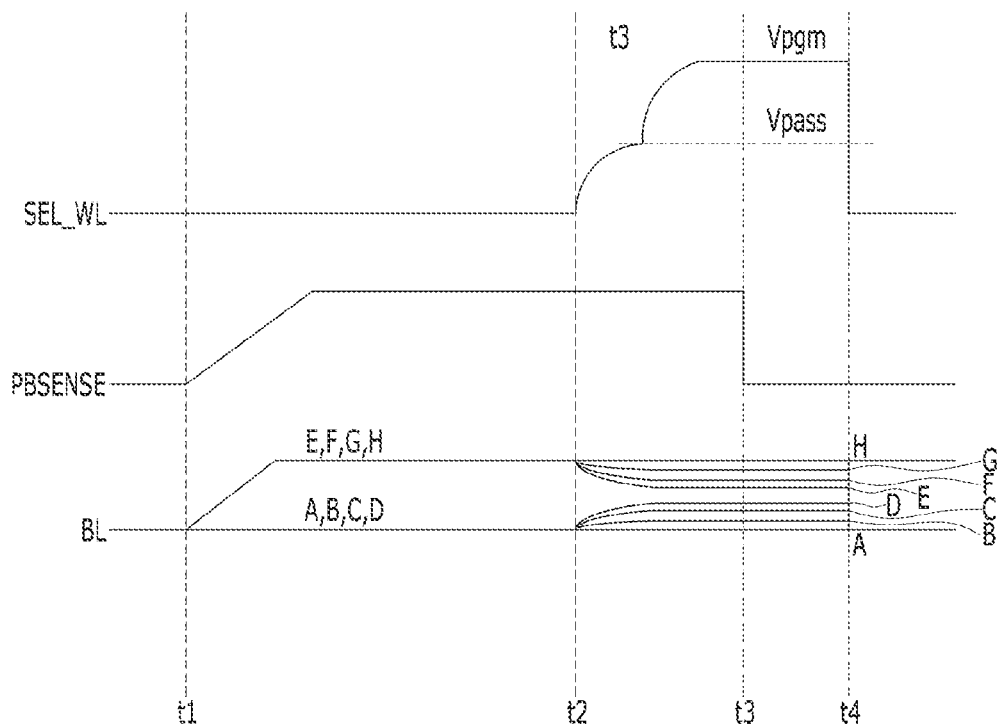
FIG. 12 is a diagram illustrating an operation of the page buffer circuit illustrated in FIG. 11 in accordance with the second embodiment.

FIG. 12 is a diagram illustrating an operation of the page buffer circuit illustrated in FIG. 11 in accordance with the second embodiment.

Referring to FIG. 12, a program operation included in a program loop may include a bit line setup operation t1 to t3 and a program voltage application operation t2 to t4.

In the bit line setup operation, the N types of M-bit setting codes may be input to the M latches included in each PBx of the plurality of page buffers PB1 to PBm, and the N types of column voltages A, B, C, D, E, F, G and H may be generated. The generated N types of column voltages A, B, C, D, E, F, G and H may be selectively applied to each of bit lines coupled to memory cells of a selected word line selected as a program target among a plurality of word lines.

According to an embodiment, the second column voltage H, which is the highest voltage among the N types of column voltages A, B, C, D, E, F, G and H and has the power source voltage VCORE level, may be applied, as an inhibiting voltage, to a bit line coupled to a program inhibited cell among the plurality of memory cells included in the selected word line. The first column voltage A, which is the lowest voltage among the N types of column voltages A, B, C, D, E, F, G and H, may be applied, as a first allowable voltage, to a bit line coupled to a first cell having the lowest threshold voltage among the plurality of memory cells included in the selected word line. The second third column voltage B, which is the second lowest voltage among the N types of column voltages A, B, C, D, E, F, G and H, may be applied, as a second allowable voltage, to a bit line coupled to a second cell having a threshold voltage higher than the threshold voltage of the first cell and lower than a threshold voltage of a third cell among the plurality of memory cells included in the selected word line. The second third column voltage C, which is the third lowest voltage among the N types of column voltages A, B, C, D, E, F, G and H, may be applied, as a third allowable voltage, to a bit line coupled to the third cell having a threshold voltage higher than the threshold voltage of the second cell and lower than a threshold voltage of a fourth cell among the plurality of memory cells included in the selected word line. The third third column voltage D, which is the fourth lowest voltage among the N types of column voltages A, B, C, D, E, F, G and H, may be applied, as a fourth allowable voltage, to a bit line coupled to the fourth cell having a threshold voltage higher than the threshold voltage of the third cell and lower than a threshold voltage of a fifth cell among the plurality of memory cells included in the selected word line. The first fourth column voltage E, which is the fifth lowest voltage among the N types of column voltages A, B, C, D, E, F, G and H may be applied, as a fifth allowable voltage, to a bit line coupled to the fifth cell having a threshold voltage higher than the threshold voltage of the fourth cell and lower than a threshold voltage of a sixth cell among the plurality of memory cells included in the selected word line. The second fourth column voltage F, which is the sixth lowest voltage among the N types of column voltages A, B, C, D, E, F, G and H may be applied, as a sixth allowable voltage, to a bit line coupled to the sixth cell having a threshold voltage higher than the threshold voltage of the fifth cell and lower than a threshold voltage of a seventh cell among the plurality of memory cells included in the selected word line. The third fourth column voltage G, which is the seventh lowest voltage among the N types of column voltages A, B, C, D, E, F, G and H may be applied, as a seventh allowable voltage, to a bit line coupled to the seventh cell having a threshold voltage higher than the threshold voltage of the sixth cell and lower than a threshold voltage of the program inhibited cell among the plurality of memory cells included in the selected word line.

As described above, any one of the N types of column voltages A, B, C, D, E, F, G and H may be applied to each of the plurality of bit lines through the bit line setup operation, and then the program voltage may be applied to the selected word line through the program voltage application operation. Accordingly, in the program voltage application operation, the intensity of the program operation on the seventh cell may be lower than that of the program operation on the sixth cell. At the same time, the intensity of the program operation on the sixth cell may be lower than that of the program operation on the fifth cell. At the same time, the intensity of the program operation on the fifth cell may be lower than that of the program operation on the fourth cell. At the same time, the intensity of the program operation on the fourth cell may be lower than that of the program operation on the third cell. At the same time, the intensity of the program operation on the third cell may be lower than that of the program operation on the second cell. At the same time, the intensity of the program operation on the second cell may be lower than that of the program operation on the first cell. Of course, the program operation on the program inhibited cell may be restricted.

Figure 13:
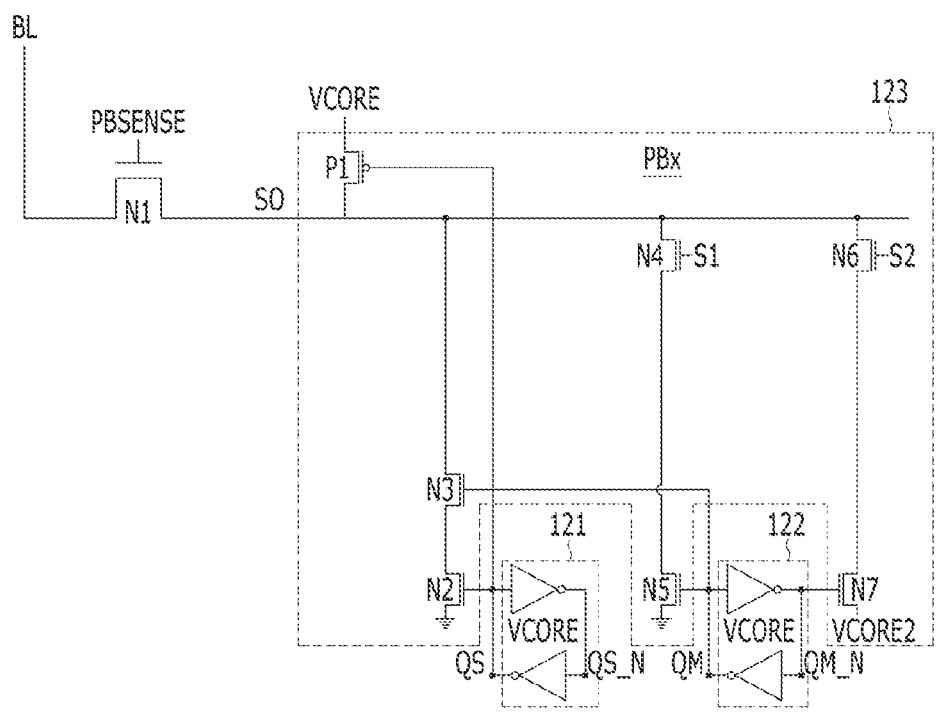
FIG. 13 is a diagram illustrating a configuration of a page buffer circuit in accordance with a third embodiment.

FIG. 13 is a diagram illustrating a configuration of a page buffer circuit in accordance with a third embodiment.

Referring to FIG. 13, the page buffer PBx is a circuit diagram illustrating any one of the plurality of page buffers PB1 to PBm described with reference to FIG. 2. Each PBx of the plurality of page buffers PB1 to PBm may include M latches. Herein, "M" may be a natural number equal to or greater than 2. In the drawing, it may be seen that each PBx of the plurality of page buffers PB1 to PBm includes two latches 121 and 122 on the assumption that "M" is 2.

Comparing the configuration of the page buffer circuit according to the first embodiment disclosed in FIG. 9 and the configuration of the page buffer circuit according to the third embodiment disclosed in FIG. 13, it may be seen that FIG. 9 illustrates the configuration of the page buffer circuit that operates with one power source voltage VCORE and one ground voltage VSS applied thereto, whereas FIG. 13 illustrates the configuration of the page buffer circuit that operates with two power source voltages VCORE and VCORE2 and one ground voltage VSS applied thereto.

Accordingly, differences between the configuration of the page buffer circuit according to the first embodiment disclosed in FIG. 9 and the configuration of the page buffer circuit according to the third embodiment disclosed in FIG. 13 are described hereinafter.

Referring to FIG. 13, each PBx of the plurality of page buffers PB1 to PBm may include the M latches 121 and 122, an NMOS transistor N1 and a coupling control unit 123. Herein, "M" may be a natural number equal to or greater than 2.

The NMOS transistor N1 may couple a bit line BL to a sensing node SO in response to a voltage application signal PBSENSE having any one of a predetermined level and M−K+1 types of selection levels.

The coupling control unit 123 may couple a ground voltage VSS terminal and any one of K types of power source voltage VCORE and VCORE2 terminals having sequential levels lower than the predetermined level to the sensing node SO in response to each of the N types of M-bit setting codes being input to the M latches 121 and 122. Herein, "K" may be a natural number equal to or greater than "M".

According to an embodiment, on the assumption that "K" and "M" are each 2 and "N" is 4, the coupling control unit 123 may couple the bit line BL to the sensing node SO in response to the voltage application signal PBSENSE having any one of the selection level and the predetermined level.

According to an embodiment, on the assumption that "K" and "M" are each 2 and "N" is 4, the coupling control unit 123 may couple the ground voltage VSS terminal and any one of 2 types of power source voltage VCORE and VCORE2 terminals having sequential levels lower than the predetermined level to the sensing node SO in response to each of 4 types of 2-bit setting codes being input to the M latches 121 and 122.

Referring to FIGS. 2, 4 and 13, the control circuit 152 may generate the voltage application signal PBSENSE having any one of the predetermined level and the M−K+1 types of the selection levels in the bit line setup operation, and input the voltage application signal PBSENSE to the NMOS transistor N1 included in each PBx of the plurality of page buffers PB1 to PBm.

Among the plurality of page buffers PB1 to PBm, a page buffer where the voltage application signal PBSENSE having the predetermined level higher than K types of power source voltage levels generated by the control circuit 152 is applied to the internal NMOS transistor N1 may control the bit line BL and the sensing node SO to be maintained in an electrically-coupled state during a period of the bit line setup operation. In this case, a voltage level loaded on the sensing node SO may be transferred to the bit line BL without loss in the bit line setup operation.

Among the plurality of page buffers PB1 to PBm, a page buffer where the voltage application signal PBSENSE having the M−K+1 types of the selection levels lower than at least one of the K types of the power source voltage levels generated by the control circuit 152 is applied to the internal NMOS transistor N1 may electrically couple the bit line BL to the sensing node SO during the period of the bit line setup operation, but the voltage level loaded on the sensing node SO may be NMOS-clamped by the NMOS transistor N1 and transferred to the bit line BL.

In addition, the control circuit 152 may control the coupling control unit 123 to input a plurality of M-bit setting codes to the M latches 121 and 122 included in each PBx of the plurality of page buffers PB1 to PBm and couple the sensing node SO to the ground voltage VSS terminal and any one of the K types of power source voltage VCORE and VCORE2 terminals in the bit line setup operation.

Referring to FIGS. 2, 4 and 13, the control logic 153 may control the control circuit 152 to generate the voltage application signal PBSENSE having any one of the predetermined level and the M−K+1 types of the selection levels and input the voltage application signal PBSENSE to the NMOS transistor N1 included in each PBx of the plurality of page buffers PB1 to PBm in the bit line setup operation.

Under the control of the control logic 153, among the plurality of page buffers PB1 to PBm, a page buffer where the voltage application signal PBSENSE having the predetermined level higher than K types of the power source voltage levels generated by the control circuit 152 is applied to the internal NMOS transistor N1 may control the bit line BL and the sensing node SO to be maintained in an electrically-coupled state during the period of the bit line setup operation. In this case, a voltage level loaded on the sensing node SO may be transferred to the bit line BL without loss in the bit line setup operation.

Under the control of the control logic 153, among the plurality of page buffers PB1 to PBm, a page buffer where the voltage application signal PBSENSE having the M−K+1 types of the selection levels lower than at least one of the K types of the power source voltage levels generated by the control circuit 152 is applied to the internal NMOS transistor N1 may electrically couple the bit line BL to the sensing node SO during the period of the bit line setup operation, but the voltage level loaded on the sensing node SO may be NMOS-clamped by the NMOS transistor N1 and transferred to the bit line BL.

In addition, the control logic 153 may control the coupling control unit 123 to input a plurality of M-bit setting codes to the M latches 121 and 122 included in each PBx of the plurality of page buffers PB1 to PBm and couple the sensing node SO to the ground voltage VSS terminal and any one of the K types of power source voltage VCORE and VCORE2 terminals in the bit line setup operation.

More specifically, referring to FIG. 13, the coupling control unit 123 may control the ground voltage VSS level to be loaded on the sensing node SO in response to a first setting code, among the N types of M-bit setting codes, being input to the M latches 121 and 122 included in each PBx of the plurality of page buffers PB1 to PBm.

According to an embodiment, on the assumption that "N" is 4 and "M" is 2, when the first setting code having a value of "00" is applied to respective input terminals QS_N and QM_N of the two latches 121 and 122, and values of respective output terminals QS and QM of the two latches 121 and 122 are "11", three NMOS transistors N2, N3 and N5 included in the coupling control unit 123 may be turned on, and one NMOS transistor N7 and one PMOS transistor P1 included in the coupling control unit 123 may be turned off, and thus the ground voltage VSS level may be loaded on the sensing node SO. For reference, the two NMOS transistors N4 and N6 included in the coupling control unit 123 may be controlled to be turned on/off in response to operating signals S1 and S2. Since it may be assumed that the operating signals S1 and S2 are signals activated in the bit line setup operation, it may be assumed that the two NMOS transistors N4 and N6 are always turned on during the operation of the coupling control unit 123.

The coupling control unit 123 may control the power supply voltage VCORE level to be loaded on the sensing node SO in response to a second setting code, among the N types of M-bit setting codes, being input to the M latches 121 and 122 included in each PBx of the plurality of page buffers PB1 to PBm. According to an embodiment, on the assumption that "N" is 4 and "M" is 2, when the second setting code having a value of "11" is applied to the respective input terminals QS_N and QM_N of the two latches 121 and 122, and the values of the respective output terminals QS and QM of the two latches 121 and 122 are "00", three NMOS transistors N2, N3 and N5 included in the coupling control unit 123 may be turned off, one NMOS transistor N7 and one PMOS transistor P1 included in the coupling control unit 123 may be turned on, and thus each of the first power source voltage VCORE level and the second power source voltage VCORE2 level may be loaded on the sensing node SO. At this time, since it may be assumed that the first power source voltage VCORE level is higher than the second power source voltage VCORE2 level, the first power source voltage VCORE level may be loaded on the sensing node SO. For example, the first power source voltage VCORE level may be 1.8 V, and the second power source voltage VCORE 2 level may be 0.3 V. Accordingly, the first power source voltage VCORE level having 1.8 V may be loaded on the sensing node SO.

The coupling control unit 123 may control the first power source voltage VCORE level to be loaded on the sensing node SO in response to a third setting code, among the N types of M-bit setting codes, being input to the M latches 121 and 122 included in each PBx of the plurality of page buffers PB1 to PBm. According to an embodiment, on the assumption that "N" is 4 and "M" is 2, when the third setting code having a value of "10" is applied to the respective input terminals QS_N and QM_N of the two latches 121 and 122, and the values of the respective output terminals QS and QM of the two latches 121 and 122 are "01", two NMOS transistors N3 and N5 and one PMOS transistor P1 included in the coupling control unit 123 may be turned on, two NMOS transistors N2 and N7 included in the coupling control unit 123 may be turned off, and thus the first power source voltage VCORE level may be loaded on the sensing node SO.

The coupling control unit 123 may control the second power source voltage VCORE2 level to be loaded on the sensing node SO in response to a fourth setting code, among the N types of M-bit setting codes, being input to the M latches 121 and 122 included in each PBx of the plurality of page buffers PB1 to PBm. According to an embodiment, on the assumption that "N" is 4 and "M" is 2, when the fourth setting code having a value of "01" is applied to the respective input terminals QS_N and QM_N of the two latches 121 and 122, and the values of the respective output terminals QS and QM of the two latches 121 and 122 are "10", three NMOS transistors N2, N3 and N5 and one PMOS transistor P1 included in the coupling control unit 123 may be turned off, one NMOS transistor N7 included in the coupling control unit 123 may be turned on, and thus the second power source voltage VCORE2 level may be loaded on the sensing node SO.

More specifically, referring to FIG. 13, when the voltage application signal PBSENSE having the predetermined level higher than the first power source voltage VCORE level is applied to the NMOS transistor N1 during the period of the bit line setup operation, a potential level of the sensing node SO determined by the coupling control unit 123 may be transferred to the bit line BL as it is.

However, when the voltage application signal PBSENSE having the selection level lower than the voltage level loaded on the sensing node SO is applied to the NMOS transistor N1 during the period of the bit line setup operation, a potential level of the bit line BL may be determined through the NMOS clamping method. According to an embodiment, when the first power source voltage VCORE level is loaded on the sensing node SO, and the voltage application signal PBSENSE lower than the first power source voltage VCORE level is applied to the NMOS transistor N1 during the period of the bit line setup operation, the level of the bit line BL may be a level obtained by subtracting a threshold voltage level of the NMOS transistor N1 from the selection level. For example, when the first power source voltage VCORE level is 1.8 V, the selection level is 1.2V, and the threshold voltage level of the NMOS transistor N1 is 0.7 V, the level of the bit line BL may be 0.5 V.

Figure 14:
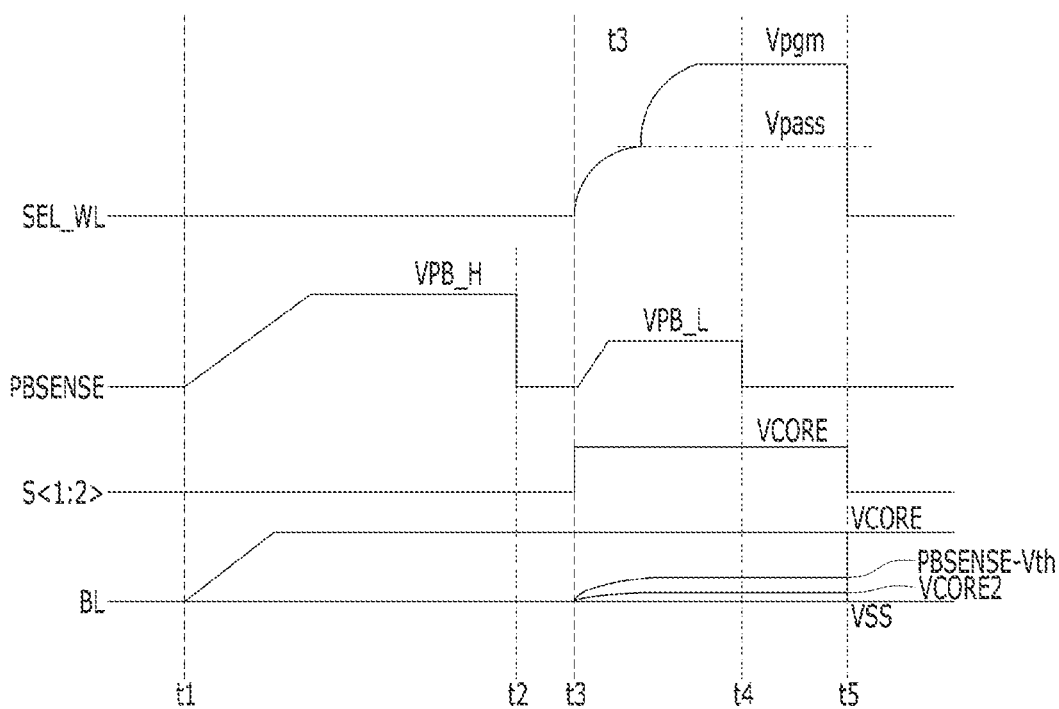
FIG. 14 is a diagram illustrating an operation of the page buffer circuit illustrated in FIG. 13 in accordance with the third embodiment.

FIG. 14 is a diagram illustrating an operation of the page buffer circuit illustrated in FIG. 13 in accordance with the third embodiment.

Referring to FIG. 14, a program operation included in a program loop may include a bit line setup operation t1 to t4 and a program voltage application operation t3 to t5.

In the bit line setup operation, the N types of M-bit setting codes may be input to the M latches included in each PBx of the plurality of page buffers PB1 to PBm, and N types of column voltages VSS, VCORE2, PBSENSE-Vth and VCORE may be generated. The generated N types of column voltages VSS, VCORE2, PBSENSE-Vth and VCORE may be selectively applied to each of bit lines coupled to memory cells of a selected word line selected as a program target among a plurality of word lines.

A page buffer, which has to transfer the first power source voltage VCORE level loaded on the sensing node SO to the bit line BL, among the plurality of page buffers PB1 to PBm, may receive the voltage application signal PBSENSE having a predetermined level VPB_H higher than the first power source voltage VCORE level continuously in the bit line setup operation t1 to t4. On the other hand, a page buffer, which has to transfer the second power source voltage VCORE2 level loaded on the sensing node SO, the ground voltage VSS level or a clamping voltage PBSENSE-Vth level to the bit line BL, among the plurality of page buffers PB1 to PBm, may receive the voltage application signal PBSENSE having a selection level VPB_L lower than the first power source voltage VCORE level during some periods t3 to t4 of the bit line setup operation t1 to t4.

According to an embodiment, the first power source voltage VCORE, which is the highest voltage among the N types of column voltages VSS, VCORE2, PBSENSE-Vth and VCORE, may be applied, as an inhibiting voltage, to a bit line coupled to a program inhibited cell among the plurality of memory cells included in the selected word line. The ground voltage VSS, which is the lowest voltage among the N types of column voltages VSS, VCORE2, PBSENSE-Vth and VCORE, may be applied, as a first allowable voltage, to a bit line coupled to a first cell having a threshold voltage lower than the additional verification voltage PVT among the plurality of memory cells included in the selected word line. The voltage PBSENSE-Vth, which is the third highest voltage among the N types of column voltages VSS, VCORE2, PBSENSE-Vth and VCORE, may be applied, as a second allowable voltage, to a bit line coupled to a second cell having a threshold voltage higher than the additional verification voltage PVT and lower than the pre-verification voltage PVP among the plurality of memory cells included in the selected word line. The second power source voltage VCORE2, which is the second highest voltage among the N types of column voltages VSS, VCORE2, PBSENSE-Vth and VCORE, may be applied, as a third allowable voltage, to a bit line coupled to a third cell having a threshold voltage higher than the pre-verification voltage PVP and lower than the main verification voltage PVM among the plurality of memory cells included in the selected word line.

As described above, any one of the N types of column voltages VSS, VCORE2, PBSENSE-Vth and VCORE may be applied to each of the plurality of bit lines through the bit line setup operation, and then the program voltage may be applied to the selected word line through the program voltage application operation. Accordingly, in the program voltage application operation, the intensity of the program operation on the third cell may be lower than that of the program operation on the second cell. At the same time, the intensity of the program operation on the second cell may be lower than that of the program operation on the first cell. Of course, the program operation on the program inhibited cell may be restricted.

Figure 15:
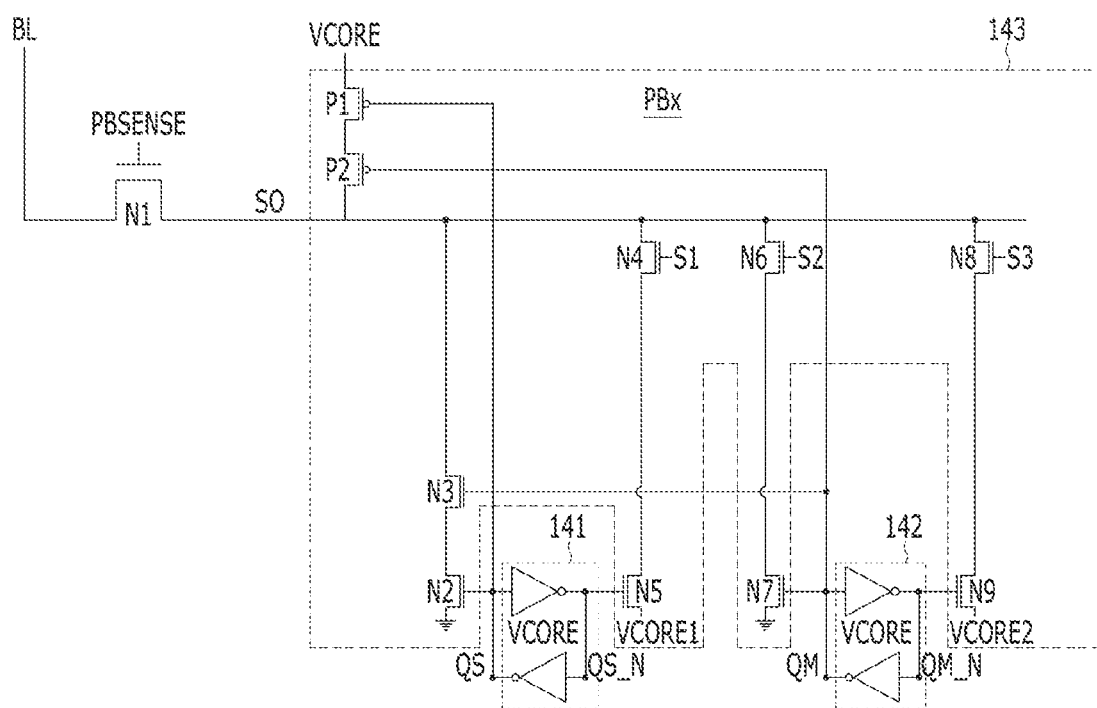
FIG. 15 is a diagram illustrating a configuration of a page buffer circuit in accordance with a fourth embodiment.

FIG. 15 is a diagram illustrating a configuration of a page buffer circuit in accordance with a fourth embodiment.

Referring to FIG. 15, the page buffer PBx is a circuit diagram illustrating any one of the plurality of page buffers PB1 to PBm described with reference to FIG. 2. Each PBx of the plurality of page buffers PB1 to PBm may include M latches. Herein, "M" may be a natural number equal to or greater than 2. In the drawing, it may be seen that each PBx of the plurality of page buffers PB1 to PBm includes two latches 141 and 142 on the assumption that "M" is 2.

Comparing the configuration of the page buffer circuit according to the third embodiment disclosed in FIG. 13 and the configuration of the page buffer circuit according to the fourth embodiment disclosed in FIG. 15, it may be seen that FIG. 13 illustrates the configuration of the page buffer circuit that operates with two power source voltages VCORE and VCORE2 and one ground voltage VSS applied thereto, whereas FIG. 15 illustrates the configuration of the page buffer circuit that operates with three power source voltages VCORE, VCORE1 and VCORE2 applied thereto.

Accordingly, differences between the configuration of the page buffer circuit according to the third embodiment disclosed in FIG. 13 and the configuration of the page buffer circuit according to the fourth embodiment disclosed in FIG. 15 are described hereinafter.

Referring to FIG. 15, each PBx of the plurality of page buffers PB1 to PBm may include the M latches 141 and 142, an NMOS transistor N1 and a coupling control unit 143. Herein, "M" may be a natural number equal to or greater than 2.

The NMOS transistor N1 may couple a bit line BL to a sensing node SO in response to a voltage application signal PBSENSE having any one of a predetermined level and M−K+1 types of selection levels.

The coupling control unit 143 may couple a ground voltage VSS terminal and any one of K types of power source voltage VCORE, VCORE1 and VCORE2 terminals having sequential levels lower than the predetermined level to the sensing node SO in response to each of N types of M-bit setting codes being input to the M latches 141 and 142. Herein, "K" may be a natural number equal to or greater than "M".

According to an embodiment, on the assumption that "K" is 3 and "M" is 2, the coupling control unit 143 may couple the bit line BL to the sensing node SO in response to the voltage application signal PBSENSE having the predetermined level since the voltage application signal PBSENSE having the selection level might not be present.

According to an embodiment, on the assumption that "K" is 3 and "M" is 2, the coupling control unit 143 may couple the ground voltage VSS terminal and any one of 3 types of power source voltage VCORE, VCORE1 and VCORE2 terminals having sequential levels lower than the predetermined level to the sensing node SO in response to each of 4 types of 2-bit setting codes being input to the two latches 141 and 142.

More specifically, referring to FIG. 15, the coupling control unit 143 may control the ground voltage VSS level to be loaded on the sensing node SO in response to a first setting code, among the N types of M-bit setting codes, being input to the M latches 141 and 142 included in each PBx of the plurality of page buffers PB1 to PBm. According to an embodiment, on the assumption that "N" is 4 and "M" is 2, when the first setting code having a value of "00" is applied to respective input terminals QS_N and QM_N of the two latches 141 and 142, and values of respective output terminals QS and QM of the two latches 141 and 142 are "11", three NMOS transistors N2, N3 and N7 included in the coupling control unit 143 may be turned on, and two NMOS transistors N5 and N9 and two PMOS transistors P1 and P2 included in the coupling control unit 143 may be turned off, and thus the ground voltage VSS level may be loaded on the sensing node SO. For reference, three NMOS transistors N4, N6 and N8 included in the coupling control unit 143 may be controlled to be turned on/off in response to operating signals S1, S2 and S3. Since it may be assumed that the operating signals S1, S2 and S3 are signals activated in the bit line setup operation, it may be assumed that the three NMOS transistors N4, N6 and N8 are always turned on during the operation of the coupling control unit 143.

The coupling control unit 143 may control the first power source voltage VCORE level to be loaded on the sensing node SO in response to a second setting code, among the N types of M-bit setting codes, being input to the M latches 141 and 142 included in each PBx of the plurality of page buffers PB1 to PBm. According to an embodiment, on the assumption that "N" is 4 and "M" is 2, when the second setting code having a value of "11" is applied to the respective input terminals QS_N and QM_N of the two latches 141 and 142, and the values of the respective output terminals QS and QM of the two latches 141 and 142 are "00", the three NMOS transistors N2, N3 and N7 included in the coupling control unit 143 may be turned off, the two NMOS transistors N5 and N9 and the two PMOS transistors P1 and P2 included in the coupling control unit 143 may be turned on, and thus each of the first power source voltage VCORE level, the second power source voltage VCORE2 level and a third power source voltage VCORE1 level may be loaded on the sensing node SO. At this time, since it may be assumed that the first power source voltage VCORE level is higher than the second and third power source voltage VCORE2 and VCORE1 levels, the first power source voltage VCORE level may be loaded on the sensing node SO. For example, the first power source voltage VCORE level may be 1.8 V, the second power source voltage VCORE2 level may be 0.3 V, and the third power source voltage VCORE1 level may be 0.5 V. Accordingly, the first power source voltage VCORE level having 1.8 V may be loaded on the sensing node SO.

The coupling control unit 143 may control the third power source voltage VCORE1 level to be loaded on the sensing node SO in response to a third setting code, among the N types of M-bit setting codes, being input to the M latches 141 and 142 included in each PBx of the plurality of page buffers PB1 to PBm. According to an embodiment, on the assumption that "N" is 4 and "M" is 2, when the third setting code having a value of "10" is applied to the respective input terminals QS_N and QM_N of the two latches 141 and 142, and the values of the respective output terminals QS and QM of the two latches 141 and 142 are "01", three NMOS transistors N3, N5 and N7 and one PMOS transistor P1 included in the coupling control unit 143 may be turned on, two NMOS transistors N2 and N9 and one PMOS transistor P2 included in the coupling control unit 143 may be turned off, and thus the third power source voltage VCORE1 level may be loaded on the sensing node SO.

The coupling control unit 143 may control the second power source voltage VCORE2 level to be loaded on the sensing node SO in response to a fourth setting code, among the N types of M-bit setting codes, being input to the M latches 141 and 142 included in each PBx of the plurality of page buffers PB1 to PBm. According to an embodiment, on the assumption that "N" is 4 and "M" is 2, when the fourth setting code having a value of "01" is applied to the respective input terminals QS_N and QM_N of the two latches 141 and 142, and the values of the respective output terminals QS and QM of the two latches 141 and 142 are "10", three NMOS transistors N3, N5 and N7 and one PMOS transistor P1 included in the coupling control unit 143 may be turned off, two NMOS transistors N2 and N9 and one PMOS transistor P2 included in the coupling control unit 143 may be turned on, and thus the second power source voltage VCORE2 level may be loaded on the sensing node SO.

Figure 16:
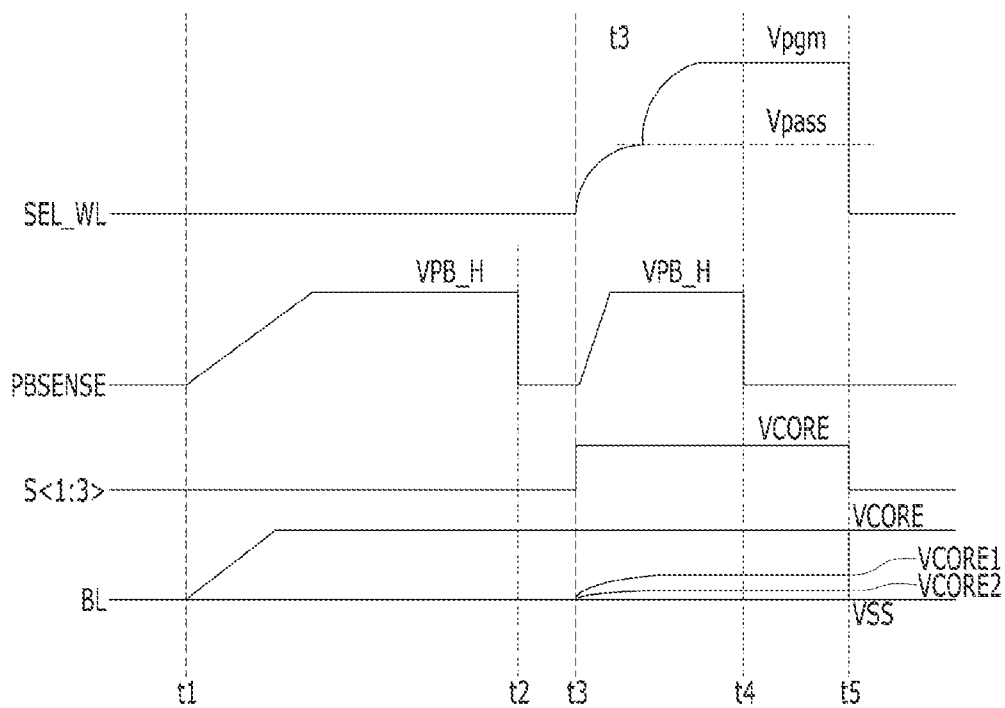
FIG. 16 is a diagram illustrating an operation of the page buffer circuit illustrated in FIG. 15 in accordance with the fourth embodiment.

FIG. 16 is a diagram illustrating an operation of the page buffer circuit illustrated in FIG. 15 in accordance with the fourth embodiment.

Referring to FIG. 16, a program operation included in a program loop may include a bit line setup operation t1 to t4 and a program voltage application operation t3 to t5.

In the bit line setup operation, the N types of M-bit setting codes may be input to the M latches included in each PBx of the plurality of page buffers PB1 to PBm, and N types of column voltages VSS, VCORE2, VCORE1 and VCORE may be generated. The generated N types of column voltages VSS, VCORE2, VCORE1 and VCORE may be selectively applied to each of bit lines coupled to memory cells of a selected word line selected as a program target among a plurality of word lines.

According to an embodiment, the first power source voltage VCORE, which is the highest voltage among the N types of column voltages VSS, VCORE2, VCORE1 and VCORE, may be applied, as an inhibiting voltage, to a bit line coupled to a program inhibited cell among the plurality of memory cells included in the selected word line. The ground voltage VSS, which is the lowest voltage among the N types of column voltages VSS, VCORE2, VCORE1 and VCORE, may be applied, as a first allowable voltage, to a bit line coupled to a first cell having a threshold voltage lower than the additional verification voltage PVT among the plurality of memory cells included in the selected word line. The third power source voltage VCORE1, which is the third highest voltage among the N types of column voltages VSS, VCORE2, VCORE1 and VCORE, may be applied, as a second allowable voltage, to a bit line coupled to a second cell having a threshold voltage higher than the additional verification voltage PVT and lower than the pre-verification voltage PVP among the plurality of memory cells included in the selected word line. The second power source voltage VCORE2, which is the second highest voltage among the N types of column voltages VSS, VCORE2, VCORE1 and VCORE, may be applied, as a third allowable voltage, to a bit line coupled to a third cell having a threshold voltage higher than the pre-verification voltage PVP and lower than the main verification voltage PVM among the plurality of memory cells included in the selected word line.

As described above, any one of the N types of column voltages VSS, VCORE2, VCORE1 and VCORE may be applied to each of the plurality of bit lines through the bit line setup operation, and then the program voltage may be applied to the selected word line through the program voltage application operation. Accordingly, in the program voltage application operation, the intensity of the program operation on the third cell may be lower than that of the program operation on the second cell. At the same time, the intensity of the program operation on the second cell may be lower than that of the program operation on the first cell. Of course, the program operation on the program inhibited cell may be restricted.

According to embodiments of the present disclosure, a set threshold voltage level and at least three verification voltages that sequentially decrease from the set threshold voltage level may be used in a verification operation on a plurality of memory cells programmed in a program state divided based on the set threshold voltage level, which makes it possible to divide the program state of the plurality of memory cells into at least four types of program states.

Through this, in various embodiments, a program operation in which any one of at least four types of column voltages is selected and applied to each of the plurality of bit lines according to at least four types of program states divided in the verification operation may be performed. Accordingly, in various embodiments, improved performance of the program operation may be expected.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure.

For example, dispositions and types of the logic gates and transistors described in the aforementioned embodiments may be implemented differently depending on the polarity of an input signal.

What is claimed is:

1. A memory device comprising:
a plurality of memory cells coupled between a plurality of word lines and a plurality of bit lines;
a control circuit suitable for performing a program loop including a program operation including a program voltage application operation on a selected word line among the plurality of word lines and a bit line setup operation on the plurality of bit lines and a verification operation of applying (N−1) first verification voltages to the selected word line according to a predetermined order to check N types of first program states for each of the plurality of memory cells included in the selected word line; and
control logic suitable for controlling the control circuit to repeatedly perform the program loop until programming for the selected word line is completed, and controlling the control circuit to apply any one of N types of column voltages to each of the plurality of bit lines in the bit line setup operation included in a second program loop according to a result of performing the verification operation included in a first program loop,
wherein the control circuit applies (N−1) second verification voltages to the selected word line according to the predetermined order to check N types of second program states for each of the plurality of memory cells included in the selected word line in the verification operation, and a maximum level of the second verification voltages is higher than a maximum level of the first verification voltages, and
wherein "N" is a natural number equal to or greater than 4.

2. The memory device of claim 1, further comprising a plurality of page buffers coupled to the plurality of memory cells, respectively, through the plurality of bit lines, and each including M latches,
wherein the control logic controls the control circuit to input N types of M-bit setting codes to the M latches included in each of the plurality of page buffers and generate the N types of column voltages in the bit line setup operation, and
wherein "M" is a natural number equal to or greater than 2.

3. The memory device of claim 2, wherein the control logic controls the control circuit to determine values of a plurality of M-bit setting codes, which correspond to the plurality of bit lines, according to the result of performing the verification operation included in the first program loop and apply, to each of the plurality of bit lines, the N types of column voltages generated by inputting each of the plurality of M-bit setting codes to the M latches included in each of the plurality of page buffers in the bit line setup operation included in the second program loop.

4. The memory device of claim 3, wherein each of the plurality of page buffers includes:
a first n-channel metal-oxide semiconductor (NMOS) transistor suitable for coupling a sensing node to a first node in response to a power source voltage applied to a gate of the first NMOS transistor;

a first p-channel metal-oxide semiconductor (PMOS) transistor suitable for coupling the sensing node to a second node in response to a ground voltage applied to a gate of the first PMOS transistor;

(N/2)-1 second NMOS transistors suitable for coupling the sensing node to (N/2)-1 third nodes in response to (N/2)-1 types of first reference voltages, respectively;

(N/2)-1 second PMOS transistors suitable for coupling the sensing node to (N/2)-1 fourth nodes in response to (N/2)-1 types of second reference voltages, respectively;

a third NMOS transistor suitable for coupling the sensing node to a bit line in response to a voltage application signal; and a coupling control unit suitable for coupling any one of the first to fourth nodes to a power source voltage terminal or a ground voltage terminal according to types of M-bit setting codes input to the M latches.

5. The memory device of claim 4, wherein, during the bit lines setup operation, the control logic controls the control circuit to generate the voltage application signal having a predetermined level higher than a power source voltage level and input the voltage application signal to the third NMOS transistor included in each of the plurality of page buffers, and controls the control circuit to input each of the plurality of M-bit setting codes to the M latches included in each of the plurality of page buffers and couple at least one of the first to fourth nodes to the power source voltage terminal or the ground voltage terminal through the coupling control unit.

6. The memory device of claim 5, wherein the coupling control unit couples the ground voltage terminal to the first node in response to a first setting code, among the N types of M-bit setting codes, being input to the M latches included in each of the plurality of page buffers, and controls a first column voltage having a ground voltage level to be loaded on the sensing node through the first NMOS transistor, the coupling control unit couples the power source voltage terminal to the second node in response to a second setting code, among the N types of M-bit setting codes, being input to the M latches included in each of the plurality of page buffers, and controls a second column voltage having the power source voltage level to be loaded on the sensing node through the first PMOS transistor, the coupling control unit couples the power source voltage terminal to the (N/2)-1 third nodes respectively in response to (N/2)-1 types of third setting codes, among the N types of M-bit setting codes, being input to the M latches included in each of the plurality of page buffers, and controls (N/2)-1 types of third column voltages having sequential levels between the power source voltage level and the ground voltage level to be loaded on the sensing node through an NMOS clamping method in the second NMOS transistor, and the coupling control unit couples the ground voltage terminal to the (N/2)-1 fourth nodes respectively in response to (N/2)-1 types of fourth setting codes, which do not overlap the third setting codes, among the N types of M-bit setting codes, being input to the M latches included in each of the plurality of page buffers, and controls (N/2)-1 types of fourth column voltages having sequential levels between the power source voltage level and the ground voltage level and higher than the third column voltages to be loaded on the sensing node through a PMOS clamping method in the second PMOS transistor.

7. An operating method of a memory device, comprising:
performing a program loop including a program operation including a program voltage application operation on a selected word line among a plurality of word lines and a bit line setup operation on a plurality of bit lines and a verification operation of applying (N−1) first verification voltages to the selected word line according to a predetermined order to check N types of first program states for each of a plurality of memory cells included in the selected word line; and repeatedly performing the program loop until programming for the selected word line is completed, and applying any one of N types of column voltages to each of the plurality of bit lines in the bit line setup operation included in a second program loop according to a result of performing the verification operation included in a first program loop, wherein the performing of the program loop includes applying (N−1) second verification voltages to the selected word line according to the predetermined order to check N types of second program states for each of the plurality of memory cells included in the selected word line in the verification operation, and a maximum level of the second verification voltages is higher than a maximum level of the first verification voltages, and wherein "N" is a natural number equal to or greater than 4.

8. The operating method of claim 7, wherein the applying of any one of the N types of column voltages to each of the plurality of bit lines includes:
determining a value of any one M-bit setting code, which corresponds to each of the plurality of bit lines, among N types of M-bit setting codes, according to the result of performing the verification operation included in the first program loop; and generating any one of the N types of column voltages according to the M-bit setting code determined through the determining of the value of the M-bit setting code, and applying the generated column voltage to each of the plurality of bit lines in the bit line setup operation included in the second program loop, wherein "M" is a natural number equal to or greater than 2.

9. The operating method of claim 8, wherein the applying of any one of the N types of column voltages to each of the plurality of bit lines includes applying the value of the M-bit setting code, which is determined through the determining of the value of the M-bit setting code, to a page buffer corresponding to each of the plurality of bit lines, and generating any one of the N types of column voltages.

10. A program operating method of a memory device that performs a plurality of program loops until programming for a selected word line among a plurality of word lines is completed, wherein each of the program loops includes:
generating any one of N types of column voltages according to values of N types of M-bit setting codes input to a page buffer, and applying the generated column voltage to each of a plurality of bit lines in a bit line setup operation;

applying a program voltage for the selected word line in a program voltage application operation;

applying (N−1) first verification voltages to the selected word line according to a predetermined order to check N types of first program states for each of a plurality of memory cells included in the selected word line in a verification operation; and determining the values of the N types of M-bit setting codes to be input to the page buffer in the bit line setup operation of a subsequent program loop, on the basis of a result of the application of the (N−1) first verification voltages to the selected word line according to the predetermined order, wherein "N" is a natural number equal to or greater than 4, and "M" is a natural number equal to or greater than 2.

11. The program operating method of claim 10, wherein the application of the (N−1) first verification voltages to the selected word line according to the predetermined order includes applying (N−1) second verification voltages to the selected word line according to the predetermined order to check N types of second program states for each of the plurality of memory cells included in the selected word line in the verification operation, and a maximum level of the second verification voltages is higher than a maximum level of the first verification voltages.

* * * * *